(12) United States Patent
Lee et al.

(10) Patent No.: US 12,074,255 B2
(45) Date of Patent: Aug. 27, 2024

(54) DISPLAY DEVICE

(71) Applicant: Samsung Display Co., Ltd., Yongin-si (KR)

(72) Inventors: Hyun Wook Lee, Yongin-si (KR); Myeong Hun Song, Yongin-si (KR); Jeong Hyun Lee, Yongin-si (KR); Jong Chan Lee, Yongin-si (KR); Tae Hee Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 234 days.

(21) Appl. No.: 17/202,943

(22) Filed: Mar. 16, 2021

(65) Prior Publication Data
US 2021/0351322 A1 Nov. 11, 2021

(30) Foreign Application Priority Data
May 6, 2020 (KR) .................. 10-2020-0054015

(51) Int. Cl.
| | | |
|---|---|---|
| *H01L 33/38* | (2010.01) | |
| *H01L 27/15* | (2006.01) | |
| *H01L 33/42* | (2010.01) | |
| *H01L 33/46* | (2010.01) | |
| *H01L 33/50* | (2010.01) | |

(52) U.S. Cl.
CPC ............ *H01L 33/38* (2013.01); *H01L 27/156* (2013.01); *H01L 33/42* (2013.01); *H01L 33/46* (2013.01); *H01L 33/502* (2013.01)

(58) Field of Classification Search
CPC ... H01L 25/0753; H01L 27/156; H01L 33/20; H01L 33/38; H01L 33/42; H01L 33/44; H01L 33/46; H01L 33/502; H01L 33/60; H01L 33/62
See application file for complete search history.

(56) References Cited

U.S. PATENT DOCUMENTS

| | | | |
|---|---|---|---|
| 2017/0229482 A1* | 8/2017 | Chen | ............... H01L 27/124 |
| 2018/0019369 A1* | 1/2018 | Cho | ................... H05K 1/11 |
| 2018/0019377 A1* | 1/2018 | Kim | ................. H01L 33/38 |
| 2019/0305035 A1 | 10/2019 | Cho et al. | |
| 2021/0111323 A1 | 4/2021 | Kim et al. | |

FOREIGN PATENT DOCUMENTS

| | | |
|---|---|---|
| KR | 10-2019-0115160 A | 10/2019 |
| KR | 10-2021-0044938 A | 4/2021 |

* cited by examiner

*Primary Examiner* — Matthew C Landau
*Assistant Examiner* — Dmitriy Yemelyanov
(74) *Attorney, Agent, or Firm* — Lewis Roca Rothgerber Christie LLP

(57) ABSTRACT

The display device according to an exemplary embodiment of the present disclosure includes a substrate and a display element unit. The display element unit includes a first electrode on the substrate, a second electrode on the substrate and spaced apart from the first electrode in a first direction, and a plurality of light emitting elements between the first electrode and the second electrode in a plan view. Each of the first and second electrodes includes an opening.

21 Claims, 15 Drawing Sheets

DISPLAY DEVICE

CROSS-REFERENCE TO RELATED APPLICATION

This application claims priority to and the benefit of Korean Patent Application No. 10-2020-0054015 filed in the Korean Intellectual Property Office on May 6, 2020, the entire contents of which are hereby incorporated by reference.

BACKGROUND

1. Field

Embodiments of the present disclosure relate to a display device.

2. Description of the Related Art

A display device can display an image by using a light emitting element such as a light emitting diode as a light source of pixels. Light emitting diodes exhibit relatively good durability even in harsh environmental conditions and excellent performance in terms of life-span and luminance.

Research has been conducted to manufacture a light emitting diode using a material having a highly reliable inorganic crystal structure, and to use it in a display panel of a display device and use it as light source of a pixel. As a part of such research, development of a display device that is manufactured to include a light emitting diode having dimensions of a micro-scale or nano-scale and that uses them as a light source for each pixel has been conducted.

SUMMARY

An exemplary embodiment of the present disclosure provides a display device capable of improving light emission efficiency.

A display device according to embodiments of the present disclosure includes a substrate and a display element unit. The display element unit may include a first electrode on the substrate, a second electrode on the substrate, and spaced apart from the first electrode in a first direction, and a plurality of light emitting elements between the first electrode and the second electrode in a plan view. Each of the first and second electrodes may include an opening.

In an exemplary embodiment, the opening may include a plurality of openings arranged in a second direction that crosses the first direction.

In an exemplary embodiment, each of the openings may be arranged to be spaced apart from each of the light emitting elements at a constant distance in the first direction.

In an exemplary embodiment, the opening extends along a second direction that intersects the first direction, and the opening may be spaced apart from the light emitting elements.

In an exemplary embodiment, the opening may have a shape of at least one selected from a polygon, a circle, and an ellipse.

In an embodiment, the first electrode and the second electrode may each include a transparent conductive material.

In an exemplary embodiment, the display device may further include an insulation pattern on the light emitting elements and a reflective layer on the insulation pattern.

In an embodiment, the insulation pattern and the reflective layer may cover the first electrode, the second electrode, the opening, and the light emitting elements.

In an exemplary embodiment, an upper surface of the reflective layer may be curved.

In an exemplary embodiment, the reflective layer may have a dome shape.

In an exemplary embodiment, the light emitting elements may be arranged in the second direction that crosses the first direction between the first electrode and the second electrode, and the insulation pattern and the reflective layer may cover at least a portion of the light emitting elements.

In an exemplary embodiment, the reflective layer includes at least one selected from the group consisting of Ag, Mg, Al, Pt, Pd, Au, Ni, Nd, Ir, Cr, Li, Ca, LiF/Ca, LiF/Al, Mo, Ti, and Cu.

In an exemplary embodiment, the insulation pattern may include a light-transmitting material.

In an exemplary embodiment, the display device may further include a first insulation layer on the first electrode and the second electrode, and the light emitting elements may be on the first insulation layer.

In an exemplary embodiment, the display device may further include a third electrode that contacts the first electrode and a first end of the light emitting element, and a fourth electrode that contacts the second electrode and a second end of the light emitting element.

In an exemplary embodiment, the third electrode and the fourth electrode may be on the first insulation layer, and the first insulation layer may include a first contact hole that exposes at least a portion of the first electrode and a second contact hole that exposes at least a portion of the second electrode. The third electrode may contact the first electrode through the first contact hole, and the fourth electrode may contact the second electrode through the second contact hole.

In an exemplary embodiment, the display device may further include a fixing layer on the light emitting element. The fixing layer may be between the third electrode and the fourth electrode, may contact at least a portion of an outer circumferential surface of the light emitting element, and may expose the first end and the second end of the light emitting element.

In an exemplary embodiment, the display device may further include a pixel circuit unit between the substrate and the display element unit that provides a driving current to the light emitting elements.

In an exemplary embodiment, the display device may further include a color filter layer between the display element unit and the pixel circuit unit.

In an exemplary embodiment, the color filter layer may include a wavelength conversion particle.

The display device according to the exemplary embodiments of the present disclosure can improve light emission efficiency of light emitted to a rear surface of the display device by including a dome-shaped reflective layer and electrodes including an opening.

However, the effect of the present disclosure is not limited to the effects described above, but may be variously extended in a range that does not depart from the spirit and scope of the present disclosure.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION OF THE EMBODIMENTS

Figure 1A:
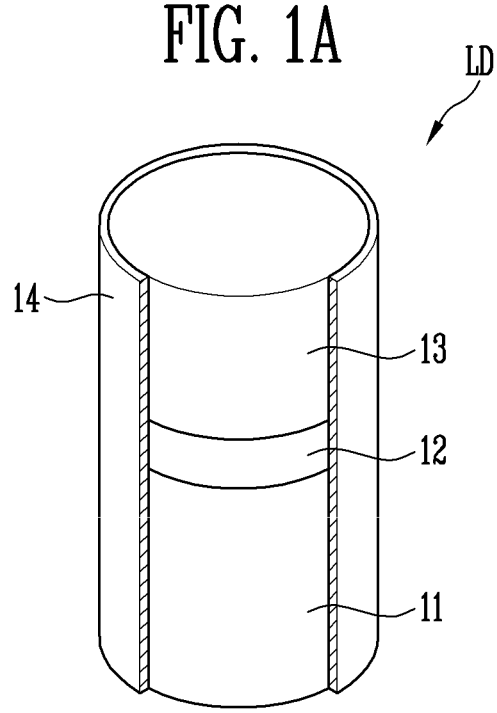
FIGS. 1A and 1B are perspective views of a light emitting element according to an exemplary embodiment.

It will be apparent to those skilled in the art that various modifications and variations can be made to the subject matter of the present disclosure without departing from the spirit or scope of the disclosure, and example embodiments are exemplified in the drawings and explained in the detailed description. Thus, it is intended that the present disclosure covers the modifications and variations of the subject matter of this disclosure provided they come within the spirit and scope of the present disclosure and its equivalents.

Like reference numerals designate like elements throughout the specification. In the accompanying drawings, dimensions of structures may be exaggerated for clarity. The terms, 'first', 'second' and the like may be simply used for description of various constituent elements, but those meanings may not be limited to the restricted meanings. The above terms are used only for distinguishing one constituent element from other constituent elements. For example, a first constituent element may be referred to as a second constituent element and similarly, the second constituent element may be referred to as the first constituent element within the scope of the appended claims, and equivalents thereof. When explaining the singular, unless explicitly described to the contrary, it may be interpreted as the plural meaning.

In this specification, the word "comprise" or "has" is used to specify existence of a feature, a number, a process, an operation, a constituent element, a part, or a combination thereof, and it will be understood that existence or additional possibility of one or more other features or numbers, processes, operations, constituent elements, parts, or combinations thereof are not excluded in advance.

In addition, when one part is referred to as being 'connected' to another part, it should be understood that the former can be 'directly connected' to the latter, or 'indirectly connected' to the latter via an intervening part.

In addition, it will be understood that when an element such as a layer, film, region, or substrate is referred to as being "on" another element, it can be directly on the other element or intervening elements may also be present. In this specification, it will be understood that when an element such as a layer, film, region, or substrate is referred to as being "on" another element, the direction is not limited to an upper direction and may include a side direction or a lower direction. In contrast, it will be understood that when an element such as a layer, film, region, or substrate is referred to as being "beneath" another element, it can be directly beneath the other element or intervening elements may also be present.

The same or similar reference numerals are used for the same constituent elements on the drawing.

Hereinafter, referring to the accompanying drawings, an exemplary embodiment of the present disclosure will be described in further detail.

Figure 1B:
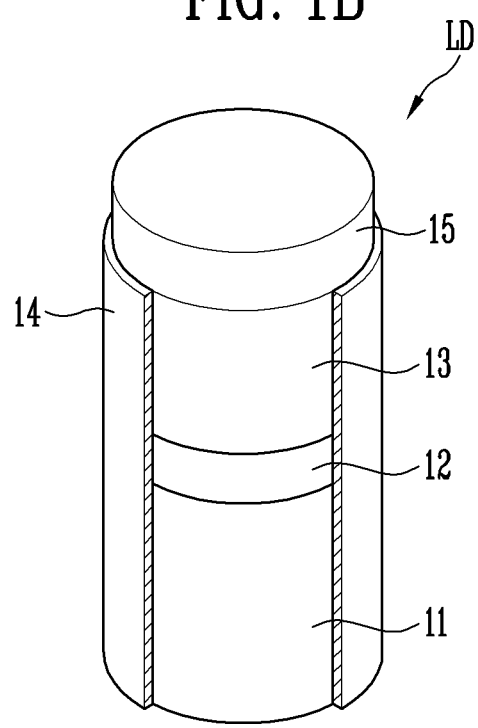

FIGS. 1A and 1B are perspective views of a light emitting element according to an exemplary embodiment.

Referring to FIGS. 1A and 1B, the light emitting element LD according to an exemplary embodiment of the present disclosure may include a first semiconductor layer 11, a second semiconductor layer 13, and an active layer 12 interposed between the first and second semiconductor layers 11 and 13. For example, the light emitting element LD may be implemented as a laminate in which the first semiconductor layer 11, the active layer 12 and the second semiconductor layer 13 are sequentially stacked.

According to an exemplary embodiment of the present disclosure, the light emitting element LD may be provided in a rod shape extending in one direction. When an extending direction of the light emitting element LD is referred to as the length direction, the light emitting element LD may have one end and the other end in the length direction.

In an exemplary embodiment of the present disclosure, one of the first and second semiconductor layers 11 and 13 may be at the one end of the light emitting element LD, and the other of the first and second semiconductor layers 11 and 13 may be at the other end of the light emitting element LD.

In an exemplary embodiment of the present disclosure, the light emitting element LD may be provided in a bar shape. As used herein, the term "bar shape" may include a rod-like shape or bar-like shape that is long (e.g., with an aspect ratio greater than 1) in the length direction, such as a circular cylinder or a polygonal cylinder. For example, the length of the light emitting element LD may be greater than a diameter of the light emitting element LD. However, the present disclosure is not limited thereto. In addition, the light emitting element LD may be a light emitting element having a core-shell structure.

For example, the light emitting element LD may be manufactured to be small enough to have a diameter and/or length of about micro-scale or nano-scale. For example, the diameter of the light emitting element LD may be 600 nm or less, and the length of the light emitting element LD may be 4 µm or less, but the size of the light emitting element LD is not limited thereto, and the size of the light emitting element LD may be changed to meet specifications or requirements of a display device to which the light emitting element LD is applied.

For example, the first semiconductor layer 11 may include at least one n-type semiconductor layer. For example, the first semiconductor layer 11 may include at least one semiconductor material selected from InAlGaN, GaN, AlGaN, InGaN, AlN, and InN, and may include a semiconductor layer doped with a first dopant such as Si, Ge, Sn, and/or the like. The material constituting the first semiconductor layer 11 is not limited thereto, and the first semiconductor layer 11 may be formed of various suitable materials in addition thereto.

The active layer 12 may be formed on the first semiconductor layer 11 and may be formed as a single or multiple-quantum well structure. When the active layer 12 includes a material having a multiple-quantum well structure, it may have a structure in which a quantum layer and a well layer are alternately stacked multiple times.

When an electric field of a set or predetermined voltage or more is applied to both ends of the light emitting element LD, the light emitting element LD emits light while electron-hole pairs are combined in the active layer 12. By controlling the light emitting of the light emitting element LD using this principle, the light emitting element LD may be used as a light source for various suitable light emitting elements as well as a pixel of a display device.

The active layer 12 can emit light with a wavelength in a range of 400 nm to 900 nm. For example, when the active layer 12 emits light at a blue wavelength band, it may include a material such as AlGaN, AlGaInN, and/or the like. In some embodiments, when the active layer 12 is a multiple-quantum well structure and a structure in which the quantum layer and the well layer are alternately stacked, the quantum layer may include a material such as AlGaN and/or AlGaInN, and the well layer may include a material such as GaN and/or AlInN. In an exemplary embodiment, the active layer 12 may include AlGaInN as the quantum layer and AlInN as the well layer, and as described above, the active layer 12 may emit blue light having a central wavelength range in a range of 450 nm to 495 nm.

However, the present disclosure is not limited thereto, and the active layer 12 may have a structure in which a semiconductor material having a large band gap energy and a semiconductor material having a small band gap energy are alternately stacked, and may include group 3 to 5 semiconductor materials selected depending on a wavelength band of the light emitted. The light emitted from the active layer 12 is not limited to light at a blue wavelength band, and may be light at red or green wavelength bands in some cases.

On the other hand, the light emitted from the active layer 12 may be emitted to both sides as well as to an outer surface in the length direction of the light emitting element LD. The direction of light emitted from the active layer 12 is not limited to one direction.

The second semiconductor layer 13 may be provided on the active layer 12 and may include a semiconductor layer of a type different from that of the first semiconductor layer 11. For example, the second semiconductor layer 13 may include at least one P-type semiconductor layer. For example, the second semiconductor layer 13 includes at least one semiconductor material selected from InAlGaN, GaN, AlGaN, InGaN, AlN, InN, and a semiconductor layer doped with a second dopant such as Mg, Zn, Ca, Se, Ba, etc. The material forming the second semiconductor layer 13 is not limited thereto, and the second semiconductor layer 13 may be formed of various suitable materials.

On the other hand, the first semiconductor layer 11 and the second semiconductor layer 13 are shown to be configured as one layer, but the present disclosure is not limited thereto. For example, the first semiconductor layer 11 and the second semiconductor layer 13 may include a larger number of layers depending on the material of the active layer 12. For example, the first semiconductor layer 11 and the second semiconductor layer 13 may further include a clad layer and/or a tensile strain barrier reducing (TSBR) layer.

According to an exemplary embodiment of the present disclosure, the light emitting element LD may further include a different phosphor layer, an active layer, a semiconductor layer and/or an electrode layer on and/or under each layer in addition to the first semiconductor layer 11, the active layer 12 and the second semiconductor layer 13 described above.

In an exemplary embodiment, the light emitting element LD may further include at least one electrode layer on one side (e.g., upper surface of the light emitting element LD) of the second semiconductor layer 13 or on one side (e.g., lower surface of the light emitting element LD) of the first semiconductor layer 11. For example, as shown in FIG. 1B, the light emitting element LD may further include an electrode layer 15 on one side of the second semiconductor layer 13. The electrode layer 15 may be an ohmic electrode, but the present disclosure is not limited thereto. For example, the electrode layer 15 may be a Schottky contact electrode (e.g., an electrode formed by a junction of a semiconductor and a metal). The electrode layer 15 may include a metal and/or a metal oxide, and for example, it may be formed of Cr, Ti, Al, Au, Ni, indium tin oxide (ITO), indium zinc oxide (IZO), zinc oxide (ZnO), and/or ITZO (indium tin zinc oxide), and/or oxides and/or alloys thereof alone or in combination, but are not limited thereto. In addition, according to an exemplary embodiment, the electrode layer 15 may be substantially transparent or translucent. Accordingly, the light generated from the light emitting element LD may transmit the electrode layer 15 and may be emitted outside the light emitting element LD.

In addition, the light emitting element LD may further include an insulation layer 14. However, according to an exemplary embodiment of the present disclosure, the insulation layer 14 may be omitted and may be provided so as to cover only a portion of the first semiconductor layer 11, the active layer 12, and the second semiconductor layer 13. For example, the insulation layer 14 may be provided at portions except for both ends of the light emitting element LD so that the both ends of the light emitting element LD may be exposed.

For better understanding and ease of description, FIGS. 1A and 1B show a shape by removing a portion of the insulation film 14, but all sides of the light emitting element LD may actually be covered by the insulation film 14.

According to an exemplary embodiment of the present disclosure, the insulation layer 14 may include a transparent insulation material. For example, the insulation film 14 may include at least one insulation material selected from the group consisting of $SiO_2$, $Si_3N_4$, $Al_2O_3$ and $TiO_2$, but the present disclosure is not limited thereto, and may include various suitable materials having an insulation property.

The insulation layer 14 may prevent or reduce occurrence of an electric short due to the active layer 12 contacting (e.g., physically contacting) a conductive material other than the first semiconductor layer 11 and the second semiconductor layer 13. In addition, by forming the insulation layer 14, it is possible to minimize or reduce occurrence of surface defects of the light emitting element LD to improve life-span and efficiency. In addition, when a plurality of light emitting elements LD are closely arranged, the insulation film 14 may prevent or reduce occurrence of an unwanted short between the light emitting elements LD.

A type, structure, and/or shape of the light emitting element LD according to an exemplary embodiment of the present disclosure may be variously changed.

Figure 2:
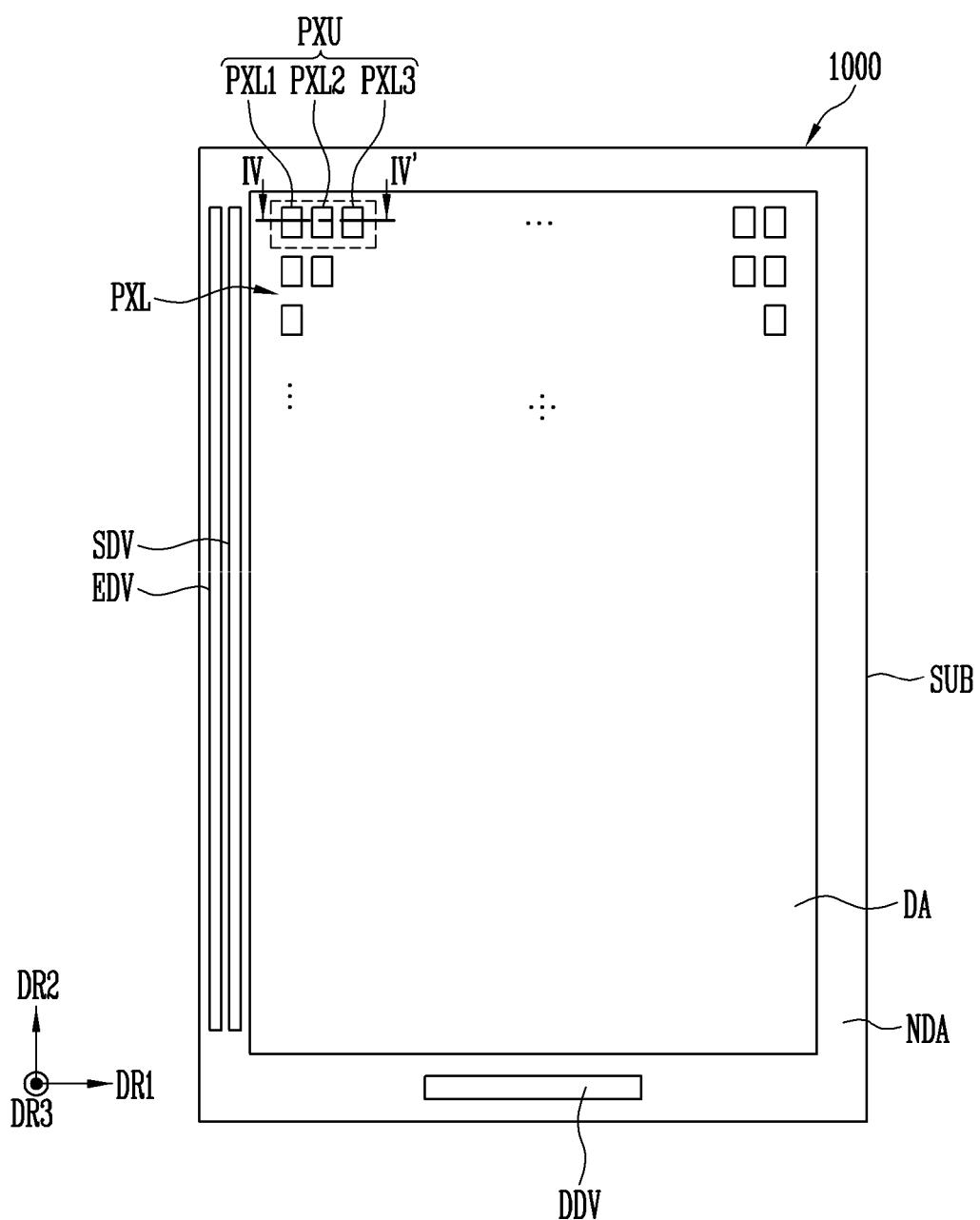
FIG. 2 is a plan view showing a display device according to an exemplary embodiment.

FIG. 2 is a plan view showing a display device according to an exemplary embodiment.

Referring to FIGS. 1A and 2, the display device 1000 may include a substrate SUB and a plurality of pixels PXL provided on the substrate SUB. In addition, the display device 1000 (or substrate SUB) may include a display area DA in which a plurality of pixels PXL are located to display an image, and a non-display area NDA excluding the display area DA.

The display area DA may be an area where a plurality of pixels PXL are provided. The non-display area NDA may be an area in which drivers SDV, DDV, and EDV for driving the pixels PXL and various lines coupling the pixels PXL and the drivers are provided.

The display area DA may have various suitable shapes. For example, the display area DA may be provided in various suitable shapes such as a closed polygon including a side formed of a straight line, a circle, an ellipse, etc. including a side formed of a curved line, a semicircle, semi-ellipse, etc. including a side formed of a straight line and a curved line.

When the display area DA includes a plurality of areas, each area may also be provided in various suitable shapes such as a closed polygon including a side formed of a straight line, a semicircle, a semi-ellipse, etc. including a side formed of a curved line. In addition, areas of a plurality of areas may be the same as or different from each other. In the exemplary embodiment of the present disclosure, a case where the display area DA is provided as one area having a quadrangle shape including a side of a straight line will be described as an example.

The non-display area NDA may be provided on at least one side of the display area DA. In an exemplary embodiment of the present disclosure, the non-display area NDA may surround the display area DA.

The pixels PXL may be provided in the display area DA on the substrate SUB. Each of the pixels PXL may include at least one light emitting element LD coupled to a scan line and a data line, and driven by a scan signal and a data signal.

Each of the pixels PXL may emit any one selected from red, green, and blue colors, but the present disclosure is not limited thereto. For example, each of the pixels PXL may emit any one selected from cyan, magenta, yellow, and white colors.

In some embodiments, the pixels PXL may include a first pixel PXL1 (or a first sub-pixel) that emits light of a first color, and a second pixel PXL2 (or a second sub-pixel) that emits light of a second color different from the first color, and a third pixel PXL3 (or a third sub-pixel) that emits light of a third color different from the first color and the second color. At least one of the first pixel PXL1, the second pixel PXL2, and the third pixel PXL3 adjacent to each other may constitute one pixel unit PXU capable of emitting light of various suitable colors.

According to an exemplary embodiment, the first pixel PXL1 may be a red pixel that emits red light, the second pixel PXL2 may be a green pixel that emits green light, and the third pixel PXL3 may be a blue pixel that emits blue light.

In an exemplary embodiment, each of the pixels PXL may include a light emitting element that emits light of the same (e.g., substantially the same) color as each other, but may emit light of different colors from each other by including a light conversion layer (e.g., color filter layer, etc.) of different colors on each light emitting element. In another exemplary embodiment, each pixel PXL may include a light emitting element that emits light of different colors. However, the color, type, and/or number of each pixel PXL is not particularly limited.

A plurality of pixels PXL may be provided and may be arranged in a first direction DR1 and a second direction DR2 crossing the first direction DR1. However, an arrangement of the pixels PXL is not particularly limited, and may be arranged in various suitable forms.

The drivers SDV, DDV, and EDV may provide a signal to each pixel PXL through each line unit, and thus may control a driving of each pixel PXL. The line unit is omitted from FIG. 2 for better understanding and ease of description.

The drivers SDV, DDV, and EDV may include a scan driver SDV providing a scan signal to the pixels PXL through a scan line, a data driver DDV providing a data signal to the pixels PXL through a data line, an emission control driver EDV providing a light emission control signal to the pixels PXL through a light emission control line, and a timing controller. The timing controller may control the scan driver SDV, the data driver DDV, and the emission control driver EDV. According to an embodiment, the emission control driver EDV may be omitted.

The scan driver SDV may be on one side of the substrate SUB, and may be arranged in one direction (e.g., second direction DR2). The scan driver SDV may be mounted on the substrate SUB as a separate component, but the present disclosure is not limited thereto. For example, the scan driver SDV may be directly formed on (e.g., may be physically on) the substrate SUB. In addition, the scan driver SDV may be outside the substrate SUB, and may be coupled to each pixel PXL through a separate connection member.

The data driver DDV may be on one side of the substrate SUB, and may be arranged in a direction (e.g., first direction DR1) crossing the scan driver SDV described above. The data driver DDV may be mounted on the substrate SUB as a separate component, or may be outside the substrate SUB and may be coupled to each pixel PXL through a separate connection member.

The emission control driver EDV may be on one side of the substrate SUB, and may be arranged in one direction (e.g., second direction DR2). As shown in FIG. 2, the emission control driver EDV may be on the same side as the scan driver SDV, but the present disclosure is not limited thereto. For example, the emission control driver EDV may be on a different side from the scan driver SDV. The emission control driver EDV may be mounted on the substrate SUB as a separate component, but the present disclosure is not limited thereto. For example, the emission control driver EDV may be directly formed on (e.g., may be physically on) the substrate SUB. In addition, the emission control driver EDV may be outside the substrate SUB and may be coupled to each pixel PXL through a separate connection member.

In an exemplary embodiment, each of the pixels PXL may be configured as an active pixel. However, the type, structure, and/or driving method of the pixels PXL capable of being applied to the present disclosure are not particularly limited.

Figure 3A:
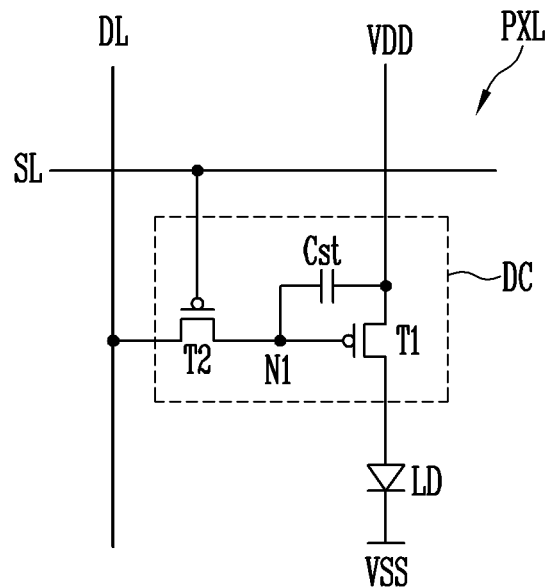
FIG. 3A to 3C are circuit diagrams showing a pixel according to an exemplary embodiment.
Figure 3B:
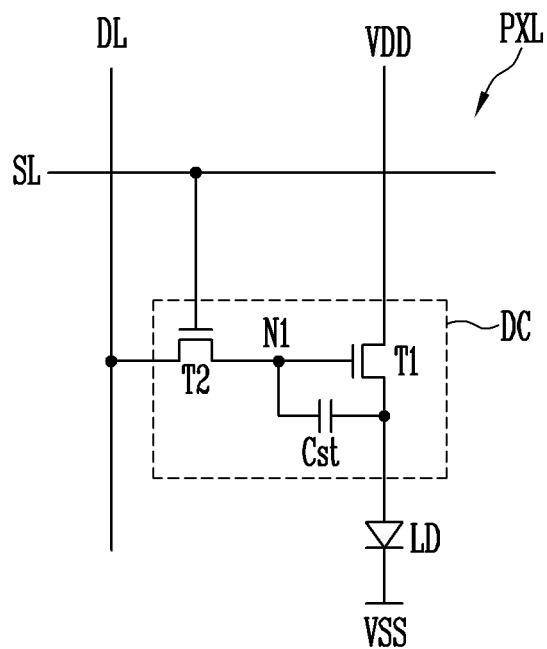
Figure 3C:
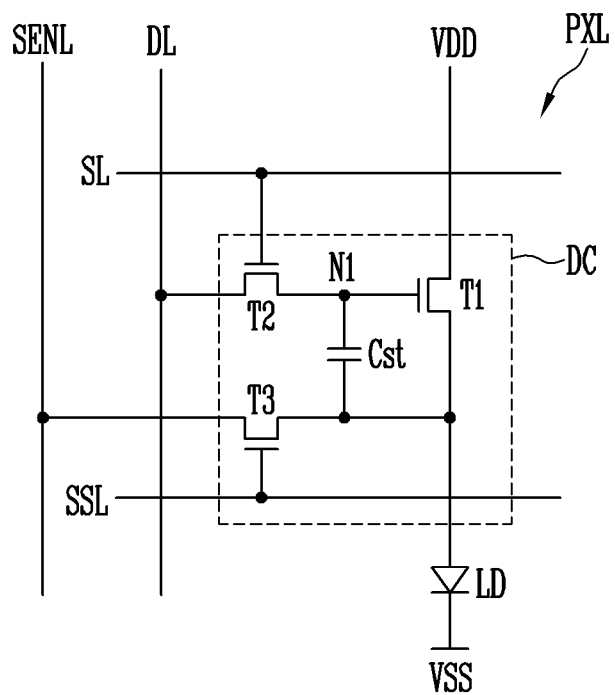

FIG. 3A to 3C are circuit diagrams showing a pixel according to an exemplary embodiment. For example, FIGS. 3A to 3C show an example of pixels constituting an active light emitting display panel.

Referring to FIGS. 1A to 3A, the pixel PXL may include at least one light emitting element LD and a driving circuit DC coupled thereto to drive the light emitting element LD.

A first electrode (e.g., anode) of the light emitting element LD may be coupled to a first power supply VDD via the driving circuit DC, and a second electrode (e.g., cathode) of the light emitting element LD may be coupled to the second power supply VSS. The light emitting element LD may emit light with luminance corresponding to an amount of a driving current controlled by the driving circuit DC.

Although only one light emitting element LD is illustrated in FIG. 3A, this is an exemplary configuration, and the actual pixel PXL may include a plurality of light emitting elements LD. The plurality of light emitting elements LD may be coupled to each other in parallel and/or in series.

The first power supply VDD and the second power supply VSS may have different potentials. For example, a potential of the first power supply VDD may be higher than a potential of the second power supply VSS by a threshold voltage of the light emitting element LD or more. In some embodiments, a voltage applied through the first power supply VDD may be larger than a voltage applied through the second power supply VSS.

According to an exemplary embodiment of the present disclosure, the driving circuit DC may include a first transistor T1, a second transistor T2, and a storage capacitor Cst.

A first electrode of the first transistor T1 (e.g., driving transistor) may be coupled to the first power supply VDD, and a second electrode thereof may be electrically coupled to the first electrode (e.g., anode electrode) of the light emitting element LD. A gate electrode of the first transistor T1 may be coupled to a first node N1. The first transistor T1 may control an amount of driving current supplied to the light emitting elements LD in response to a voltage of the first node N1.

A first electrode of the second transistor T2 (e.g., switching transistor) may be coupled to the data line DL, and the second electrode thereof may be coupled to the first node N1. Here, the first electrode and the second electrode of the second transistor T2 may be different electrodes. For example, when the first electrode is a source electrode, the second electrode may be a drain electrode. A gate electrode of the second transistor T2 may be coupled to the scan line SL.

When a scan signal of a voltage (e.g., gate-on voltage) at which the second transistor T2 can be turned on is supplied from the scan line SL, the second transistor T2 is turned on to electrically couple the data line DL and the first node N1. At this time, the data signal of the corresponding frame may be supplied to the data line DL, and accordingly, the data signal may be transferred to the first node N1. The data signal transferred to the first node N1 may be stored in the storage capacitor Cst.

One electrode of the storage capacitor Cst may be coupled to the first power supply VDD, and the other electrode thereof may be coupled to the first node N1. The storage capacitor Cst may be charged with a voltage corresponding to the data signal supplied to the first node N1, and may maintain the charged voltage until a data signal of the next frame is supplied.

For better understanding and ease of description, FIG. 3A shows the driving circuit DC having a relatively simple structure including a second transistor T2 for transferring the data signal into each pixel PXL, a storage capacitor Cst for storing the data signal, the first transistor T1 for supplying the driving current corresponding to the data signal to the light emitting element LD.

However, the present disclosure is not limited thereto, and a structure of the driving circuit DC may be variously changed. For example, the driving circuit DC may further include various suitable transistors such as a compensation transistor to compensate for the threshold voltage of the first transistor T1, an initialization transistor to initialize the first node N1, and/or an emission control transistor to control an emission time of the light emitting element LD, and/or the like, or other circuit elements such as a boosting capacitor to boost a voltage of the first node N1, and/or the like.

In addition, transistors included in the driving circuit DC, for example, both the first and second transistors T1 and T2 are shown as P-type transistors in FIG. 3A, but the present disclosure is not limited thereto. In some embodiments, at least one selected from the first and second transistors T1 and T2 included in the driving circuit DC may be changed to an N-type transistor.

For example, as shown in FIG. 3B, the first and second transistors T1 and T2 of the driving circuit DC may be implemented as an N-type transistor. The driving circuit DC shown in FIG. 3B may have a configuration or operation similar to the driving circuit DC of FIG. 3A except for changing a connection position of some constituent elements due to a change in transistor type. Therefore, duplicative description thereof will not be repeated here.

In another exemplary embodiment, referring to FIG. 3C, the pixel PXL may further include a third transistor T3 (e.g., sensing transistor).

A gate electrode of the third transistor T3 may be coupled to a sensing scan line SSL. A first electrode of the third transistor T3 may be coupled to a sensing line SENL, and a second electrode of the third transistor T3 may be coupled to the anode of the light emitting element LD. The third transistor T3 may transfer a voltage value at the anode of the light emitting element LD to the sensing line SENL depending on a sensing signal supplied to the sensing scan line SSL during a sensing period. The voltage value transferred through the sensing line SENL may be provided to an external circuit (e.g., timing controller), and the external circuit may extract characteristic information (e.g., threshold voltage of the first transistor T1) of the pixel PXL based on the provided voltage value. The extracted characteristic information may be used to convert image data so that a characteristic deviation between the pixels PXL is compensated.

Figure 4:
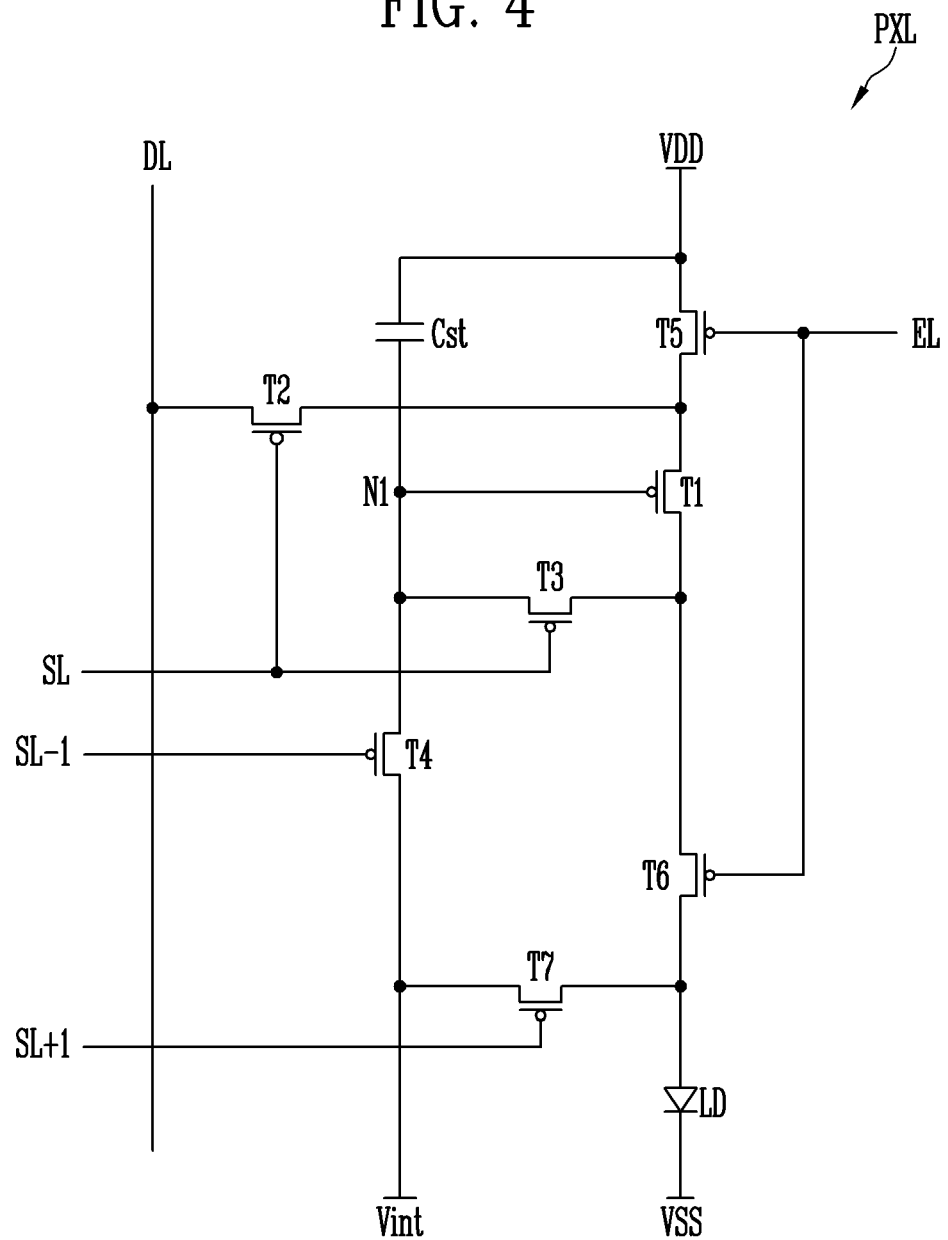
FIG. 4 is a circuit diagram showing a pixel according to another exemplary embodiment.

FIG. 4 is a circuit diagram showing a pixel according to another exemplary embodiment.

Referring to FIG. 4, the pixel PXL according to another exemplary embodiment of the present disclosure may include a light emitting element LD, first to seventh transistors T1, T2, T3, T4, T5, T6, and T7, and a storage capacitor Cst.

A first electrode (e.g., anode) of the light emitting element LD may be coupled to the first transistor T1 via a sixth transistor T6, and a second electrode (e.g., cathode) of the light emitting element LD may be coupled to the second power supply VSS. The light emitting element LD may emit light with a set or predetermined luminance corresponding to an amount of driving current supplied from the first transistor T1.

The first electrode of the first transistor T1 (e.g., driving transistor) may be coupled to the first power supply VDD via a fifth transistor T5, and the second electrode of the first transistor T1 may be coupled to the first electrode of the light emitting element LD via the sixth transistor T6. The first transistor T1 may control an amount of current flowing from the first power supply VDD to the second power supply VSS via the light emitting element LD in response to a voltage of the first node N1 which is a gate electrode of the first transistor T1.

The second transistor T2 (e.g., switching transistor) may be coupled between the data line DL and the first electrode of the first transistor T1. In addition, the gate electrode of the second transistor T2 may be coupled to the first scan line SL. The second transistor T2 may be turned on when a scan signal of a gate-on voltage is supplied to the scan line SL to electrically couple the data line DL and the first electrode of the first transistor T1.

The third transistor T3 may be coupled between the second electrode of the first transistor T1 and the first node N1. In addition, the gate electrode of the third transistor T3 may be coupled to the first scan line SL. The third transistor T3 may be turned on when a scan signal of a gate-on voltage is supplied to the scan line SL to electrically couple the second electrode of the first transistor T1 and the first electrode N1.

A fourth transistor T4 may be coupled between the first node N1 and an initialization power supply Vint. In addition, a gate electrode of the fourth transistor T4 may be coupled to a second scan line SL−1. The fourth transistor T4 may be turned on when a scan signal of a gate-on voltage is supplied to the second scan line SL−1 to supply a voltage of the initialization power supply Vint to the first node N1. Here, the initialization power supply Vint may be set to a voltage lower than a data signal. A scan signal supplied to the second scan line SL−1 may have the same (e.g., substantially the same) waveform as the scan signal supplied to the first scan line of the pixel of the previous stage.

A fifth transistor T5 may be coupled between the first power supply VDD and the first electrode of the first transistor T1. A gate electrode of the fifth transistor T5 may be coupled to an emission control line EL. The fifth transistor T5 may be turned on when an emission control signal of a gate-on voltage is supplied to the emission control line EL, and may be turned off in other cases.

A sixth transistor T6 may be coupled between the second electrode of the first transistor T1 and the first electrode of the light emitting element LD. The gate electrode of the sixth transistor T6 may be coupled to the emission control line EL. The sixth transistor T6 may be turned on when an emission control signal of a gate-on voltage is supplied to the emission control line EL, and may be turned off in other cases.

A seventh transistor T7 may be coupled between the initialization power supply Vint and the first electrode (e.g., anode) of the light emitting element LD. In addition, a gate electrode of the seventh transistor T7 may be coupled to the third scan line SL+1. The seventh transistor T7 may be turned on when a scan signal of a gate-on voltage is supplied to the third scan line SL+1 to supply a voltage of the initialization power supply Vint to the first electrode of the light emitting element LD. The scan signal supplied to the third scan line SL+1 may have the same (e.g., substantially the same) waveform as the scan signal supplied to the first scan line of the pixel of the next stage.

FIG. 4 shows a case in which a gate electrode of the seventh transistor T7 is coupled to the third scan line SL+1. However, the technical spirit of the present disclosure is not limited thereto. For example, in another exemplary embodiment of the present disclosure, the gate electrode of the seventh transistor T7 may be coupled to the first scan line SL or the second scan line SL−1. In this case, when the scan signal of the gate-on voltage is supplied to the first scan line SL or the second scan line SL−1, the voltage of the initialization power supply Vint may be supplied to the anode of the light emitting element LD via the seventh transistor T7.

The storage capacitor Cst may be coupled between the first power supply VDD and the first node N1. The data signal and a voltage corresponding to the threshold voltage of the first transistor T1 may be stored in the storage capacitor Cst.

Transistors included in the driving circuit DC, for example, first to seventh transistors T1, T2, T3, T4, T5, T6, and T7 are all shown to P-type transistors in FIG. 4, but the present disclosure is not limited thereto. For example, at least one selected from the first to seventh transistors T1, T2, T3, T4, T5, T6, and T7 may be changed to an N-type transistor.

Figure 5:
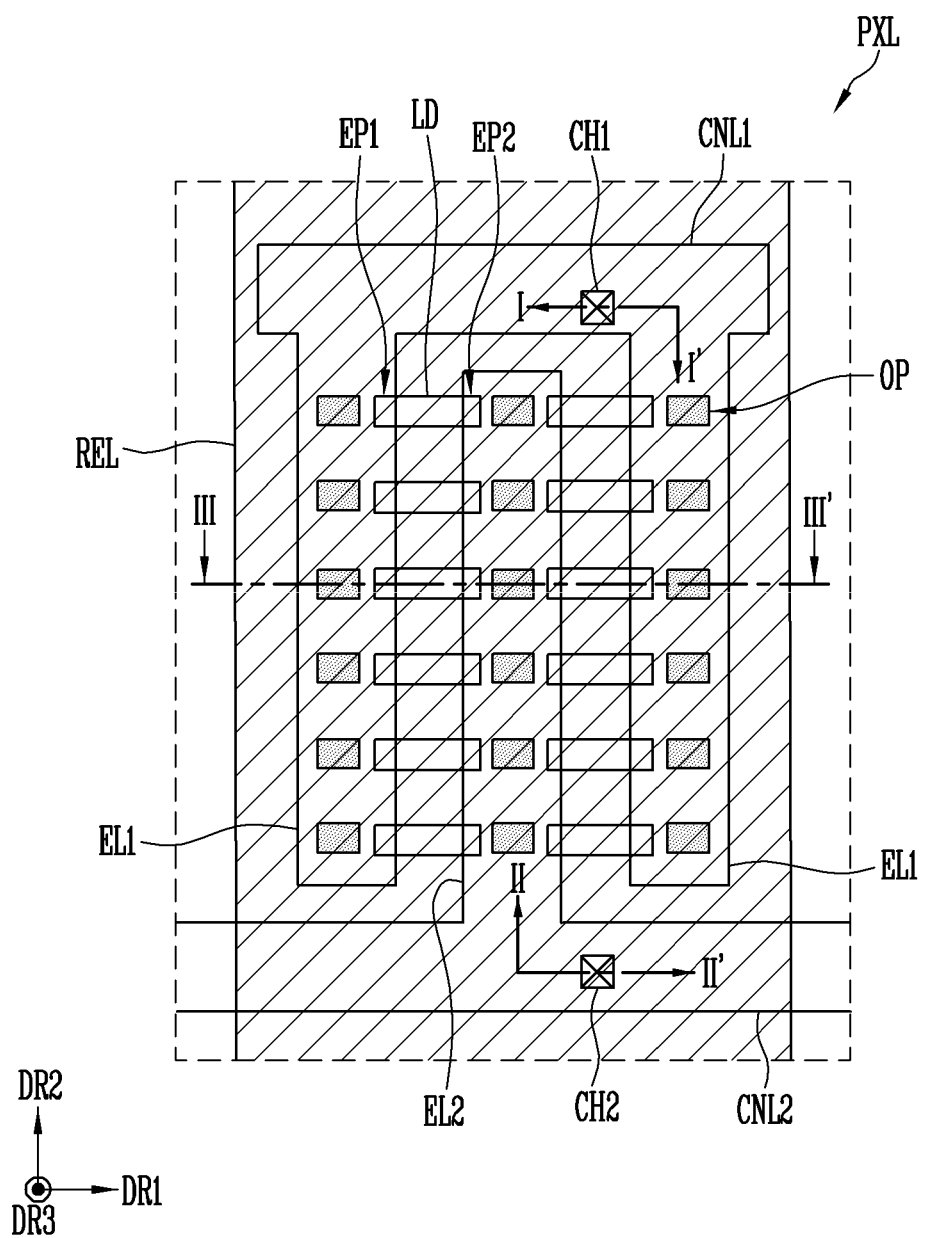
FIG. 5 is a plan view schematically showing a pixel according to an exemplary embodiment.
Figure 6:
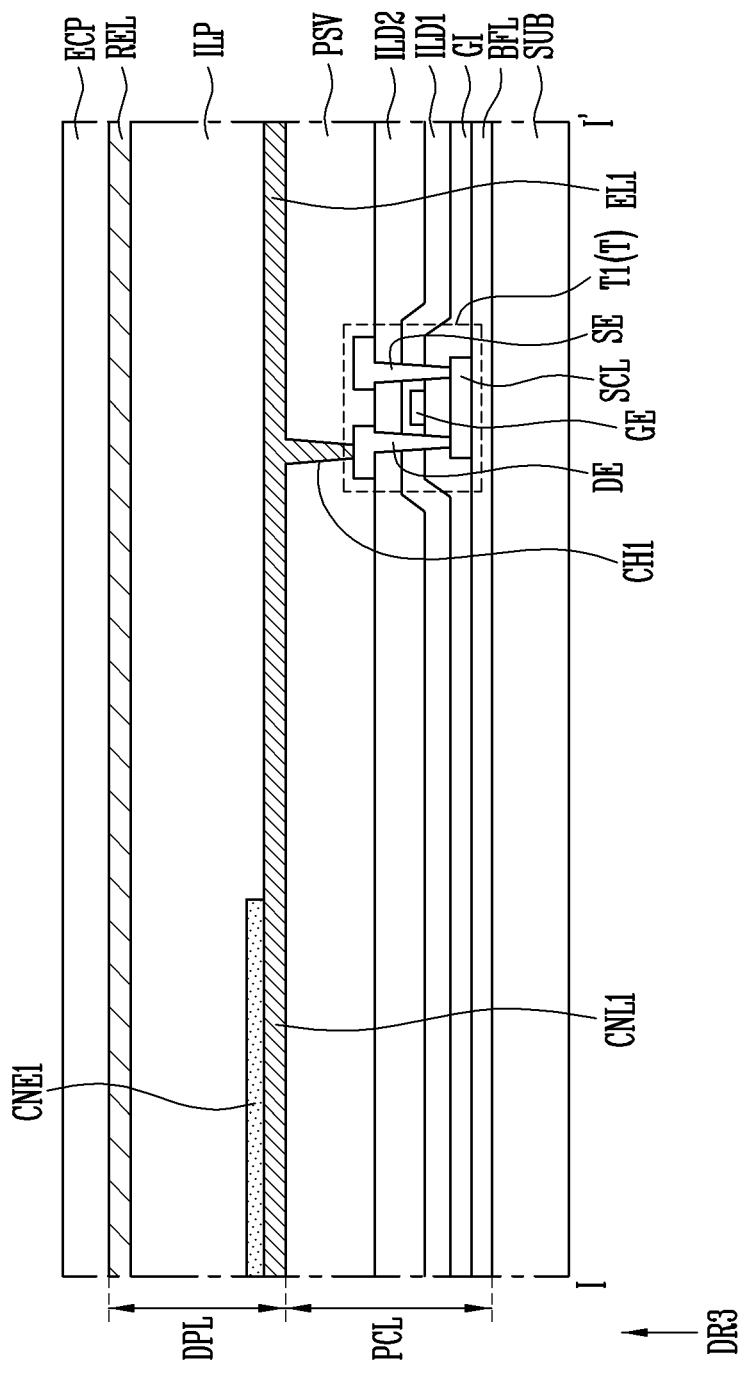
FIG. 6 is an exemplary embodiment of a cross-sectional view taken along a line I-I' of FIG. 5.
Figure 7:
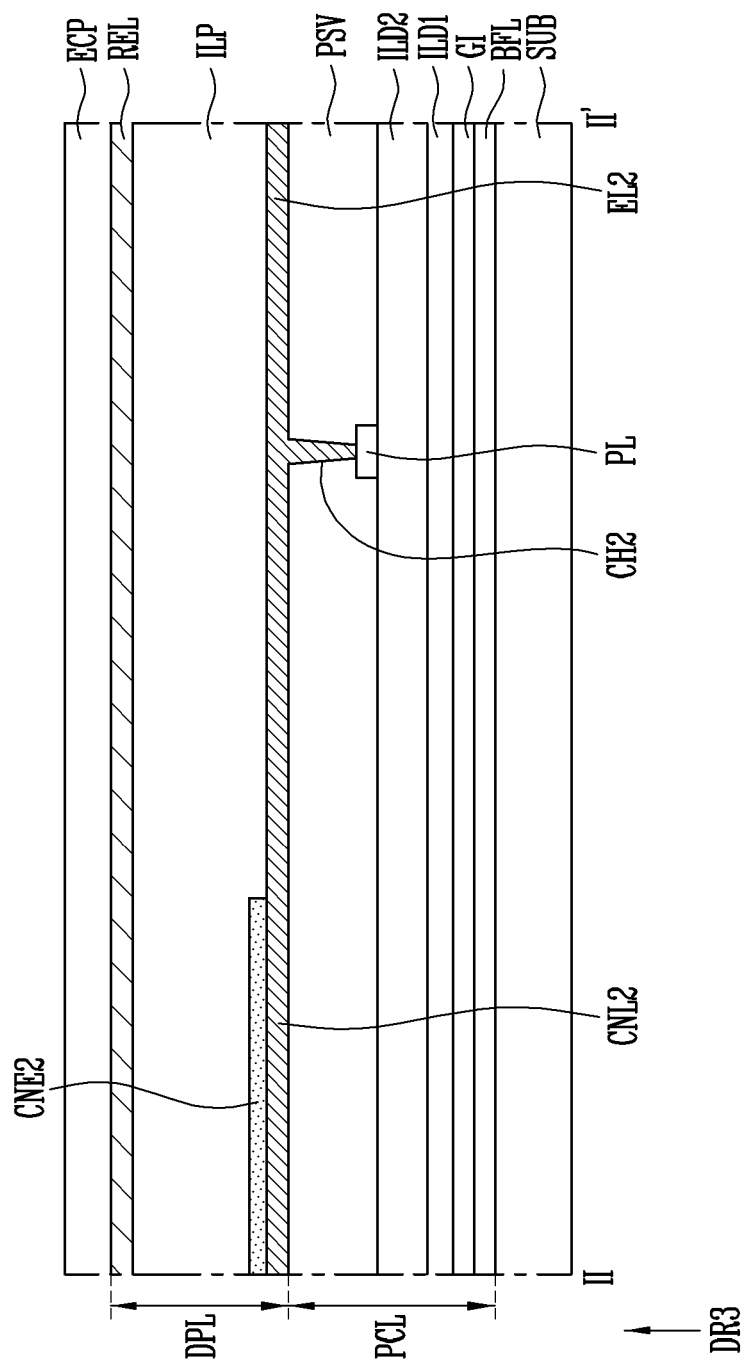
FIG. 7 is an exemplary embodiment of a cross-sectional view taken along a line II-II' of FIG. 5.
Figure 8:
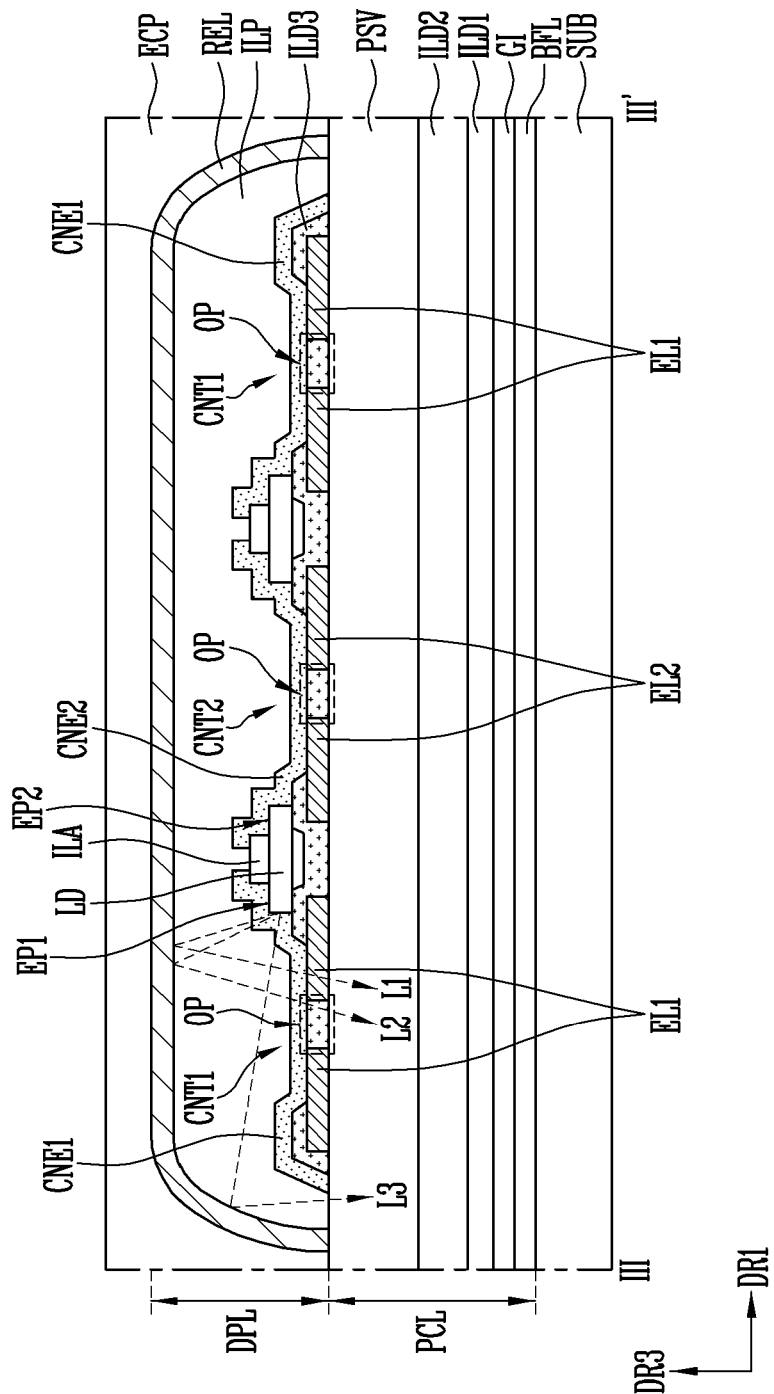
FIG. 8 is an exemplary embodiment of a cross-sectional view taken along a line III-III' of FIG. 5.
Figure 9:
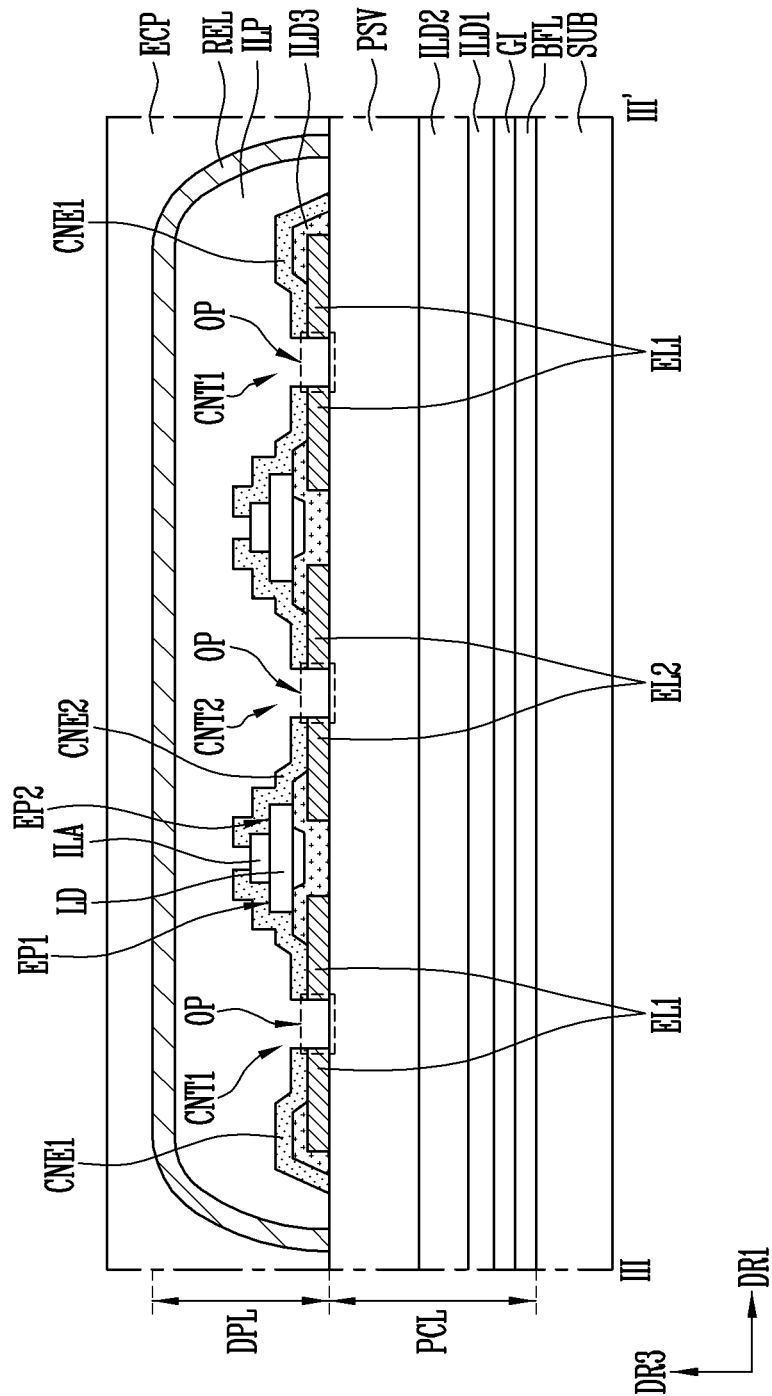
FIG. 9 is another exemplary embodiment of a cross-sectional view taken along a line III-III' of FIG. 5.
Figure 10:
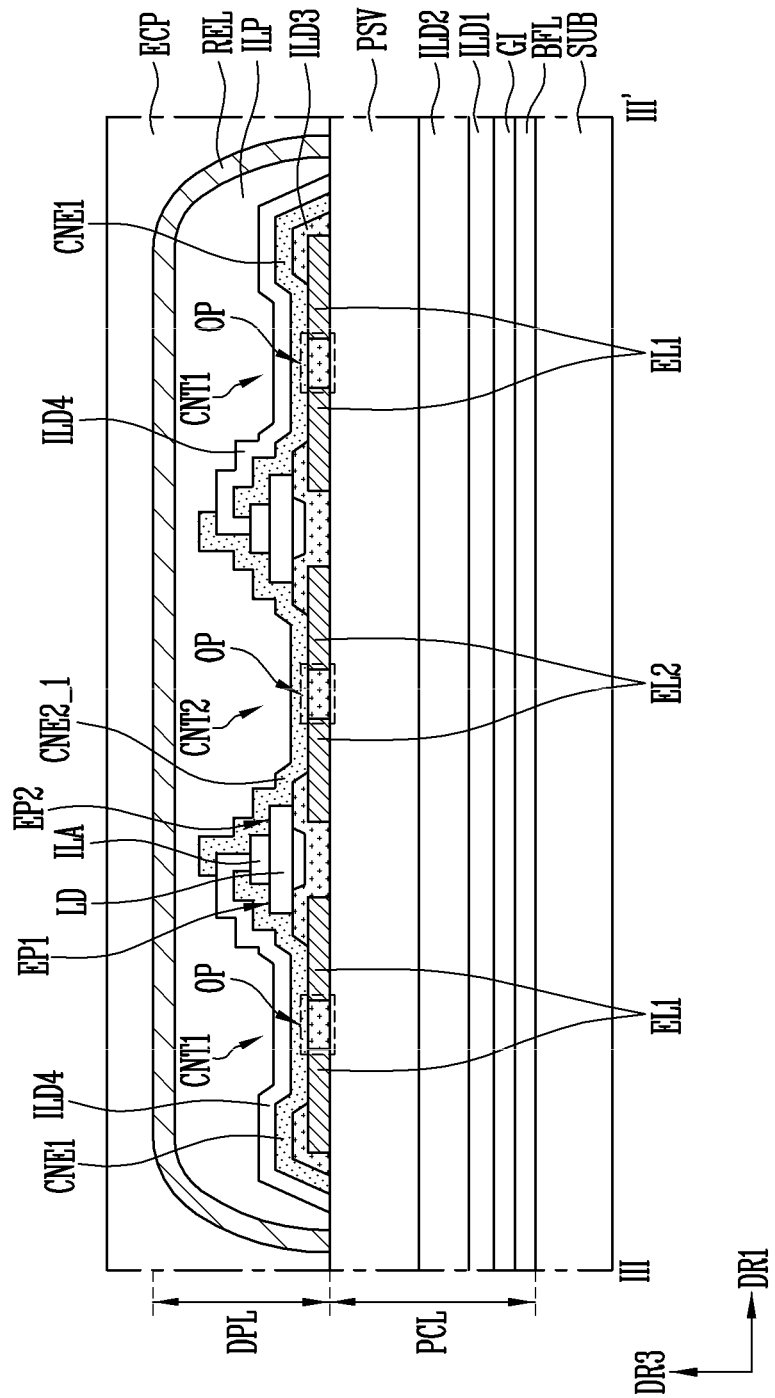
FIG. 10 is another exemplary embodiment of a cross-sectional view taken along a line III-III' of FIG. 5.

FIG. 5 is a plan view schematically showing a pixel according to an exemplary embodiment, FIG. 6 is an exemplary embodiment of a cross-sectional view taken along a line I-I' of FIG. 5, FIG. 7 is an exemplary embodiment of a cross-sectional view taken along a line II-II' of FIG. 5, FIG. 8 is an exemplary embodiment of a cross-sectional view taken along a line III-III' of FIG. 5, FIG. 9 is another exemplary embodiment of a cross-sectional view taken along a line III-III' of FIG. 5, and FIG. 10 is another exemplary embodiment of a cross-sectional view taken along a line III-III' of FIG. 5.

Here, the pixel PXL shown in FIG. 5 may be any one of the pixels PXL shown in each of FIGS. 3A to 4. For example, the pixel PXL shown in FIG. 5 may be the pixel PXL shown in FIG. 3A.

For better understanding and ease of description, the illustration of transistors coupled to the light emitting element LD and signal lines coupled to the transistor are omitted from FIG. 5.

As used herein, the statement "formed, provided, or disposed in the same layer" may refer to be formed in the same process and to include the same material.

In addition, although the light emitting elements LD are shown to be aligned in the first direction DR1 in FIG. 5, the arrangement of the light emitting elements LD is not limited thereto. For example, the light emitting elements LD may be aligned in a diagonal direction with respect to the first direction DR1.

Referring to FIGS. 1 to 3A and FIGS. 5 to 8, a display device 1000 according to an exemplary embodiment of the present disclosure includes a substrate SUB, a pixel circuit unit PCL, a display element unit DPL, and an encapsulation layer ECP.

The substrate SUB may include a transparent insulation material and transmit light. The substrate SUB may be a rigid substrate or a flexible substrate.

The rigid substrate may be, for example, one of a glass substrate, a quartz substrate, a glass ceramic substrate, and/or a crystalline glass substrate. The flexible substrate may be one of a film substrate including a polymer organic material and/or a plastic substrate. For example, the flexible substrate may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials constituting the substrate SUB may be variously changed, and may also include fiber reinforced plastic (FRP). The material to be applied to (or included in) the substrate SUB may have resistance (or heat resistance) against a high processing temperature in the manufacturing process of the display device 1000.

The pixel circuit unit PCL including the driving circuit DC may be on the substrate SUB. The pixel circuit unit PCL may include at least one transistor T (e.g., first transistor T1, second transistor T2) and a storage capacitor Cst. In addition, the scan lines SL, the data lines DL, and the power line PL may also be in the pixel circuit unit PCL. The light emitting element LD may emit light based on a signal provided from the pixel circuit unit PCL to display an image.

In some embodiments, a buffer layer BFL may be on the substrate SUB. The buffer layer BFL may prevent or reduce diffusion of impurities into the transistor T, and may serve to planarize a surface (e.g., a surface on the substrate SUB). The buffer layer BFL may be provided as a single layer, but may also be provided as a multiple layer having at least a double layer. When the buffer layer BFL is provided as a multiple layer, each layer may be formed of the same material or different materials. The buffer layer BFL may be omitted depending on materials and process conditions of the substrate SUB.

The transistor T (e.g., first transistor T1) may be on the buffer layer BFL. The transistor T may include a semiconductor pattern SCL, a gate electrode GE, a first terminal SE, and a second terminal DE. The first terminal SE may be one selected from the source electrode and the drain electrode, and the second terminal DE may be the other electrode thereof. For example, when the first terminal SE is a source electrode, the second terminal DE may be a drain electrode.

The semiconductor pattern SCL may be on the buffer layer BFL. The semiconductor pattern SCL may include a first contact region contacting the first terminal SE and a second contact region contacting (e.g., physically contacting) the second terminal DE. A region between the first contact region and the second contact region may be a channel region. The semiconductor pattern SCL may be a semiconductor pattern made of polysilicon, amorphous silicon, oxide semiconductor, and/or the like. The channel region may be a semiconductor pattern in which impurities are not doped, and may be an intrinsic semiconductor. The first contact region and the second contact region may be semiconductor patterns doped with impurities.

A gate insulation layer GI may be on the semiconductor pattern SCL. The gate insulation layer GI may be made of any one selected from silicon nitride ($SiN_x$), silicon oxide ($SiO_2$), and silicon oxynitride ($SiO_xN_y$).

The gate electrode GE may be on the semiconductor pattern SCL with the gate insulation layer GI interposed therebetween. The gate electrode GE may be arranged to overlap the semiconductor pattern SCL.

The first terminal SE and the second terminal DE may respectively contact (e.g., physically contact) the first contact region and the second contact region of the semiconductor pattern SCL through contact holes passing through first and second interlayer insulation layers ILD1 and ILD2 and the gate insulation layer GI.

In the above-described embodiment, the first and second terminals SE and DE of the transistor T are described as a separate electrode electrically coupled to the semiconductor pattern SCL through the contact holes pass through the gate insulation layer GI and the first and second interlayer insulation layers ILD1 and ILD2, but the present disclosure is not limited thereto. According to an exemplary embodiment, the first terminal SE of the transistor T may be one of the first and second contact regions adjacent to the channel region of the corresponding semiconductor pattern SCL, and the second terminal DE of the transistor T may be the other of the first and second contact regions adjacent to the channel region of the corresponding semiconductor pattern SCL. In this case, the second terminal DE of the transistor T may be electrically coupled to the light emitting elements LD of the corresponding pixel PXL through a bridge electrode or a contact electrode.

In addition, a case where the transistor T is a thin film transistor having a top gate structure is described as an example, but the present disclosure is not limited thereto. According to an exemplary embodiment, the transistor T may be a thin film transistor having a bottom gate structure.

The transistor T is described based on the first transistor T1, but the pixel circuit unit PCL may further include the second transistor T2 described with reference to FIG. 3A.

A power line PL may be provided on the second interlayer insulation layer ILD2. The power line PL may be a line to which the second power supply VSS described with reference to FIG. 3A is applied.

A passivation layer PSV may be on the transistor T and the power line PL. The passivation layer PSV may be provided in a form including an organic insulation layer, an inorganic insulation layer, and/or the organic insulation layer on the inorganic insulation layer. Here, the inorganic insulation layer may include at least one selected from metal oxides such as silicon oxide ($SiO_x$), silicon nitride ($SiN_x$), silicon nitride (SiON), and aluminum oxide ($AlO_x$). The organic insulation layer may include an organic insulation material capable of transmitting light. The organic insulation layer may include at least one selected from the group consisting of polyacrylates resin, epoxy resin, phenolic resin, polyamides resin, polyimide resin, unsaturated polyester resin, poly-phenylene ethers resin, poly-phenylene sulfides resin, and benzocyclobutene resin.

The display element unit DPL may be on the pixel circuit unit PCL (or passivation layer PSV). The display element unit DPL may include a first connection line CNL1, a second connection line CNL2, a first electrode EL1, a second electrode EL2, a first contact electrode CNE1 (or third electrode), a second contact electrode CNE2 (or fourth electrode), the light emitting elements LD, a fixing layer ILA, an insulation pattern ILP, and/or a reflective layer REL.

In some embodiments, the first connection line CNL1, the second connection line CNL2, the first electrode EL1, and/or the second electrode EL2 may be on the pixel circuit unit PCL (or passivation layer PSV).

The first connection line CNL1 may extend in the first direction DR1. The first connection line CNL1 may be provided and/or formed only inside each pixel PXL to drive each pixel PXL independently or separately from adjacent pixels PXL, may be electrically and/or physically separated from a first connection line CNL1 provided and/or formed in each of the adjacent pixels PXL. The first connection line CNL1 provided in each pixel PXL may be electrically coupled to some constituent elements, for example the first transistor T1, included in the pixel circuit unit PCL of the corresponding pixel PXL through a first via hole CH1 passing through the passivation layer PSV.

The second connection line CNL2 may extend in a direction parallel (e.g., substantially parallel) to the extending direction of the first connection line CNL1. For example, the second connection line CNL2 may extend in the first direction DR1. The second connection line CNL2 may be commonly provided to each pixel PXL and pixels PXL adjacent thereto. Accordingly, the pixels PXL in the same pixel row in the first direction DR1 may be commonly coupled to the second connection line CNL2. The second connection line CNL2 provided in each pixel PXL may be electrically coupled to some constituent elements, for example the power line PL, included in the pixel circuit unit PCL of the corresponding pixel PXL through a second via hole CH2 passing through the passivation layer PSV.

Accordingly, the second power supply VSS applied to the power line PL may be transferred to the second connection line CNL2.

The first and second connection lines CNL1 and CNL2 may include a conductive material. For example, each of the first and second connection lines CNL1 and CNL2 may be made of conductive oxides such as ITO, IZO, ZnO and/or ITZO, and/or a metal material including at least one of Ag, Mg, Al, Pt, Pd, Au, Ni, Nd, Ir, Cr, Li, Ca, Ti, and/or Cu. In addition, each of the first and second connection lines CNL1 and CNL2 may have a multilayer structure in which a plurality of layers are stacked.

Each of the first and second electrodes EL1 and EL2 may extend in one direction, for example, the second direction DR2 crossing the first direction DR1. The first electrode EL1 and the second electrode EL2 may be provided on the same surface and may be spaced apart from each other.

Each of the first electrodes EU may be branched from the first connection line CNL1 in the second direction DR2. The first electrodes EU and the first connection line CNL1 may be integrally provided to be electrically and/or physically coupled to each other. When the first electrodes EL1 and the first connection line CNL1 are integrally provided, the first connection line CNL1 may be one region of each of the first electrodes EL1, or each of the first electrodes EL1 may be one region of the first connection line CNL1. However, the present disclosure is not limited thereto, and according to an exemplary embodiment, the first electrodes EU and the first connection lines CNL1 may be formed separately from each other to be electrically coupled to each other through a contact hole and a connector.

The second electrode EL2 may be branched from the second connection line CNL2 in the second direction DR2. The second electrode EL2 may be provided integrally with the second connection line CNL2, and may be electrically and/or physically coupled to each other. When the second electrode EL2 and the second connection line CNL2 are integrally provided, the second connection line CNL2 may be one region of the second electrode EL2, or the second electrode EL2 may be one region of the connection line CNL2. However, the present disclosure is not limited thereto, and according to an exemplary embodiment, the second electrode EL2 and the second connection line CNL2 may be formed separately from each other, and may be electrically coupled to each other through contact holes and a connector.

In FIG. 5, two first electrodes EL1 are shown to be branched from the first connection line CNL1, and one second electrode EL2 is shown to be branched from the second connection line CNL2, but this embodiment is exemplary and present disclosure is not limited thereto.

The second electrode EL2 may be between the first electrodes EL1. Each of the first electrodes EL1 may be spaced apart from each other in the first direction DR1 with a set or predetermined gap the second electrode EL2. Here, each of the first electrodes EU and the second electrode EL2 may be spaced apart with the same (e.g., substantially the same) gap. Accordingly, the light emitting elements LD may be aligned more uniformly. However, the present disclosure is not limited thereto, and according to an exemplary embodiment, each of the first electrodes EL1 and the second electrode EL2 may be spaced apart with different gap from each other.

In an exemplary embodiment, each of the first and second electrodes EL1 and EL2 may be made of a transparent conductive material so that light emitted from each of the light emitting elements LD progresses in an image display direction (e.g., rear direction) of the display device 1000. For example, each of the first and second electrodes EL1 and EL2 may be made of conductive oxides such as ITO, IZO, ZnO, and/or ITZO. Because the first and second electrodes EL1 and EL2 are made of a transparent conductive material, as shown in FIG. 8, light (e.g., first light L1) emitted from the light emitting element LD may transmit the first and second electrodes EU and EL2 to progress in the image display direction. Accordingly, light emission efficiency of light emitted to a rear surface of the display device 1000 may be improved.

In an exemplary embodiment, each of the first and second electrodes EL1 and EL2 may include at least one opening OP. For example, the openings OP may be formed in the second direction DR2. Here, each of the openings OP may be formed to be spaced apart at a constant distance in the first direction DR1 from each of the light emitting elements LD. Because the first and second electrodes EL1 and EL2 include the openings OP, as shown in FIG. 8, light (e.g., second light L2) emitted from the light emitting element LD may progress in the image display direction through the openings OP. Accordingly, light emission efficiency of light emitted to the rear surface of the display device 1000 may be improved.

In some embodiments, in FIG. 5, shapes of the openings OP are shown as a quadrangle, but this is exemplary and the shape of the openings OP is not limited thereto. For example, the shape of the openings OP may be any one selected from a polygon, a circle, and an ellipse other than a quadrangle. This will be further described herein below with reference to FIG. 11.

In addition, because the first and second electrodes EL1 and EL2 include the openings OP, the first and second electrodes EL1 and EL2 may be made of an opaque metal including at least one selected from Ag, Mg, Al, Pt, Pd, Au, Ni, Nd, Ir, Cr, Li, Ca, LiF/Ca, LiF/Al, Mo, Ti, and Cu with relatively high electrical conductivity (e.g., relatively low resistivity) rather than transparent conductive oxides such as ITO, IZO, ZnO and ITZO with relatively low electrical conductivity (e.g., relatively high resistivity). In this case, because the display device 1000 includes first and second electrodes EU and EL2 made of an opaque metal with high electrical conductivity, a delay of a signal transferred through the first and second electrodes EU and EL2, can be improved.

One of the first electrode EL1 and the second electrode EL2 may be an anode electrode, and the other electrode thereof may be a cathode electrode. In an exemplary embodiment of the present disclosure, the first electrode EL1 may be an anode electrode, and the second electrode EL2 may be a cathode electrode.

The first electrode EL1 and the second electrode EL2 may be respectively coupled to the first end EP1 and the second end EP2 of the light emitting element LD to provide a driving signal to the light emitting element LD, and the light emitting element LD may emit light with a set or predetermined luminance in response to a driving current provided from the driving circuit DC.

A third interlayer insulation layer ILD3 (or first insulation layer) may be provided on the first electrode EU and the second electrode EL2. The third interlayer insulation layer ILD3 may cover the first and second electrodes EL1 and EL2.

In an exemplary embodiment, the third interlayer insulation layer ILD3 may be an inorganic insulation layer made of an inorganic material. However, the present disclosure is not limited thereto, and the third interlayer insulation layer ILD3 may be an organic insulation layer made of an organic material. In addition, the third interlayer insulation layer ILD3 may have a multilayer structure including at least two insulation layers having different physical properties.

In some embodiments, the third interlayer insulation layer ILD3 may include a first contact hole CNT1 and a second contact hole CNT2. The first contact hole CNT1 and the second contact hole CNT2 may expose at least a portion of the first electrode EL1 and the second electrode EL2.

The first and second contact holes CNT1 and CNT2 may be formed to overlap the corresponding first and second electrodes EL1 and EL2, respectively. For example, the first contact hole CNT1 may be formed to overlap the first electrode EL1, and the second contact hole CNT2 may be formed to overlap the second electrode EL2.

The first contact hole CNT1 and the second contact hole CNT2 may have a thickness and/or depth corresponding to a thickness of the third interlayer insulation layer ILD3. In some embodiments, the first contact hole CNT1 and the second contact hole CNT2 may completely pass through the third interlayer insulation layer ILD3 in the corresponding region. Accordingly, a portion of the first and second electrodes EL1 and EL2 may be exposed to the outside to contact (e.g., physically contact) the first and second contact electrodes CNE1 and CNE2, which are further described herein below.

In some embodiments, because the first electrode EL1 and the second electrode EL2 include the openings OP, in a process step of forming the third interlayer insulation layer ILD3, the third interlayer insulation layer ILD3 may be formed in the openings OP. However, the present disclosure is not limited thereto, and according to process conditions of the display device, as shown in FIG. 9, the third interlayer insulation layer ILD3 may not be formed in the openings OP. As an empty space in which the third interlayer insulation layer ILD3 is not filled is formed in the openings OP, transmittance of light (e.g., second light L2) progressing in the image display direction through the openings OP increases, and thus the light emission efficiency of the display device 1000 may be further improved.

The light emitting elements LD may be on the third interlayer insulation layer ILD3. In a plan view, the light emitting elements LD may be between the first electrode EL1 and the second electrode EL2, and some of the light emitting elements LD may be arranged to overlap a portion of the first electrode EL1 and the second electrode EL2. For example, in a plan view, the first end EP1 of each of the light emitting elements LD may be arranged to overlap a portion of the first electrode EL1, and the second end EP2 thereof may be arranged to overlap a portion of the second electrode EL2.

The fixing layer INSA for stably supporting and fixing the light emitting element LD may be on the light emitting element LD. The fixing layer INSA may be an inorganic insulation layer including an inorganic material and/or an organic insulation layer including an organic material. The fixing layer INSA may cover at least a portion of an outer peripheral (e.g., circumferential) surface of each of the light emitting elements LD, and may be formed to expose the first end EP1 and the second end EP2 of the light emitting element LD. Accordingly, the fixing layer INSA can stably support and fix the light emitting element LD, thereby preventing or reducing deviation of the light emitting element LD. According to an exemplary embodiment, the fixing layer INSA may be arranged to fill a space between the light emitting element LD and the third interlayer insulation layer ILD3. The fixing layer INSA may be omitted according to process conditions of the display device.

The first contact electrode CNE1 (or third electrode) and the second contact electrode CNE2 (or fourth electrode) may be on the first and second electrodes EL1 and EL2, the third interlayer insulation layer ILD3, the light emitting elements LD, and the fixing layer INSA.

The first contact electrode CNE1 and the second contact electrode CNE2 may contact (e.g., physically contact) one of both ends EP1 and EP2 of each light emitting element LD. For example, the first contact electrode CNE1 may contact (e.g., physically contact) the first end EP1 of each light emitting element LD, and the second contact electrode CNE2 may include the second end EP2 of each light emitting element LD.

The first contact electrode CNE1 may cover the first electrode EL1 in a plan view. The first contact electrode CNE1 may be electrically coupled to the first electrode EL1 through the first contact hole CNT1 of the third interlayer insulation layer ILD3. In some embodiments, the first contact electrode CNE1 may contact (e.g., physically contact) the first end EP1 and the first electrode EU of the light emitting element LD.

The second contact electrode CNE2 may cover the second electrode EL2 in a plan view. The second contact electrode CNE2 may be electrically coupled to the second electrode EL2 through the second contact hole CNT2 of the third interlayer insulation layer ILD3. In some embodiments, the second contact electrode CNE2 may contact (e.g., physically contact) the second end EP2 and the second electrode EL2 of the light emitting element LD.

Each of the first and second contact electrodes CNE1 and CNE2 may be made of a transparent conductive material. For example, each of the first and second contact electrodes CNE1 and CNE2 may be made of conductive oxides such as ITO, IZO, ZnO, and/or ITZO. Because the first and second contact electrodes CTE1 and CTE2 are made of a transparent conductive material, a loss of light can be reduced while light (e.g., first to third lights L1, L2, L3) emitted from the light emitting element LD progresses along a progress path. However, this is exemplary, and materials of the first and second contact electrodes CNE1 and CNE2 are not limited thereto.

In some embodiments, in a plan view, the first and second contact electrodes CNE1 and CNE2 may be formed to overlap the openings OP. However, the present disclosure is not limited thereto, and according to process conditions of the display device, as shown in FIG. 9, in a plan view, the first and second contact electrodes CNE1 and CNE2 may not overlap the openings OP. Accordingly, because the transmittance of light (e.g., second light L2) progressing in the image display direction through the openings OP increases, the light emission efficiency of the display device 1000 may be further improved.

In some embodiments, the first and second contact electrodes CNE1 and CNE2 may be on the same layer. In this case, the first and second contact electrodes CNE1 and CNE2 may be formed concurrently (e.g., at the same time), thereby simplifying a manufacturing process of the display device 1000 and reducing a manufacturing cost of the display device 1000.

However, the arrangement of the first and second contact electrodes CNE1 and CNE2 is not limited thereto. For example, as shown in FIG. 10, the first and second contact electrodes CNE1 and CNE2_1 may be on different layers. In this case, a fourth interlayer insulation layer ILD4 may be between the first contact electrode CNE1 and the second contact electrode CNE2_1.

In an exemplary embodiment, the fourth interlayer insulation layer ILD4 may be an inorganic insulation layer made of an inorganic material. However, the present disclosure is not limited thereto, and the fourth interlayer insulation layer ILD4 may be an organic insulation layer made of an organic material. In addition, the fourth interlayer insulation layer ILD4 may have a multilayer structure including at least two insulation layers having different physical properties.

For example, the fourth interlayer insulation layer ILD4 may cover one of the first and second contact electrodes CNE1 and CNE2_1, and the other of the first and second contact electrodes CNE1 and CNE2_1 may be on the fourth interlayer insulation layer ILD4. For example, the fourth interlayer insulation layer ILD4 may be on the first contact electrode CNE1 to cover the first contact electrode CNE1, and the second contact electrode CNE2_1 may be on the fourth interlayer insulation layer ILD4. In some embodiments, the first contact electrode CNE1 and the second contact electrode CNE2_1 may be electrically separated by the fourth interlayer insulation layer ILD4.

The insulation pattern ILP may be on the first and second contact electrodes CNE1 and CNE2 and the light emitting elements LD. In this case, the insulation pattern ILP may cover the plurality of light emitting elements LD arranged in a line along the second direction DR2. For example, the insulation pattern ILP may have a line shape that extends in the second direction DR2 perpendicular (e.g., substantially perpendicular) to a long axis of the light emitting element LD.

On the other hand, the insulation pattern ILP may be formed for each of the pixels PXL, and may be formed to cover the light emitting elements LD included in each pixel PXL, but the present disclosure is not limited thereto, and the insulation pattern ILP may be commonly formed in the plurality of pixels PXL, and may be formed to cover the light emitting elements LD included in the plurality of pixels PXL.

The insulation pattern ILP may be made of a light-transmitting material so as to guide light efficiently. For example, the insulation pattern ILP may be made of a polymer organic material. The polymer organic material may include at least one selected from acrylic resin, epoxy resin, polyimide, and polyethylene. However, this is exemplary, and the material of the insulation pattern ILP is not limited thereto.

The reflective layer REL may be on the insulation pattern ILP. The reflective layer REL may overlap the first and second electrodes EU and EL2, the light emitting elements LD, the fixing layer ILA, the first and second contact electrodes CNE1 and CNE2, and the third interlayer insulation layer ILD3, and the insulation pattern ILP.

In this case, the reflective layer REL may cover a plurality of light emitting elements LD arranged in a line along the second direction DR2. For example, the reflective layer REL may have a line shape that extends in the second direction DR2 perpendicular (e.g., substantially perpendicular) to the long axis of the light emitting element LD. At this time, the reflective layer REL may have substantially the same shape as a surface of the insulation pattern ILP contacting (e.g., physically contacting) the reflective layer REL. In other words, the reflective layer REL may have substantially the same shape as the insulation pattern ILP in a plan view.

The display device 1000 according to an exemplary embodiment of the present disclosure is a rear emission type, and the light (e.g., first to third lights L1, L2, L3) emitted from the light emitting element LD may be reflect from the reflective layer REL to be emitted to a rear surface of the display device 1000.

The reflective layer REL may include at least one selected from Ag, Mg, Al, Pt, Pd, Au, Ni, Nd, Ir, Cr, Li, Ca, LiF/Ca, LiF/AI, Mo, Ti, and Cu. For example, the reflective layer REL may be made of alloys, nitrides, and/or oxides including at least one selected from Ag, Mg, Al, Pt, Pd, Au, Ni, Nd, Ir, Cr, Li, Ca, LiF/Ca, LiF/AI, Mo, Ti, and Cu. These may be used alone or in combination with each other. In addition, the reflective layer REL may have a multilayer structure.

In an exemplary embodiment, an upper surface of the reflective layer REL may be curved. For example, as shown in FIG. 8, the reflective layer REL may be formed in a dome shape. In some embodiments, both ends of the reflective layer REL according to an exemplary embodiment of the present disclosure may be formed to have a constant inclination with respect to the substrate SUB. In addition, the reflective layer REL may extend from an upper surface of the insulation pattern ILP to a boundary between the insulation pattern ILP and the passivation layer PSV. Accordingly, each of the insulation pattern ILP and the reflective layer REL may directly contact (e.g., physically contact) the passivation layer PSV, and may completely cover the first and second electrodes EL1 and EL2, the light emitting elements LD, the fixing layer ILA, and the first and second contact electrodes CNE1 and CNE2, on the passivation layer PSV. Accordingly, the light emitted from the light emitting element LD may be reflected from the reflective layer REL without leakage, so that light emission efficiency of light emitted to the rear surface of the display device 1000 may be improved.

The encapsulation layer ECP may be on the reflective layer REL. The encapsulation layer ECP may be on all surfaces of the substrate SUB. The encapsulation layer ECP may prevent or reduce penetration of moisture or oxygen into the display device 1000, and may serve to planarize a top surface of the display device 1000.

The encapsulation layer ECP may be an encapsulation film or a thin film encapsulation layer. For example, when the encapsulation layer ECP is a encapsulation film, the encapsulation layer ECP may be made of at least one selected from a polyethylene (PET) film, a polypropylene (PP) film, a polyamide (PA) film, a polyacetal (POM) film, a polymethyl methacrylate (PMMA) film, a polybutylene terephthalate (PBT) film, a polycarbonate (PC) film, a cellulose film, and a moisture-proof cellophane. In addition, when the encapsulation layer ECP is a thin film encapsulation layer, the encapsulation layer ECP may include at least one inorganic film and at least one organic film alternately arranged. However, the present disclosure is not limited thereto, and the encapsulation layer ECP may be an encapsulation substrate.

At this time, the encapsulation layer ECP may be formed to a thickness of 10 μm or less. Therefore, an overall thickness of the display device 1000 may be formed to be thin. However, this is exemplary, and the thickness of the encapsulation layer ECP is not limited thereto.

As described with reference to FIGS. 5 to 10, the display device 1000 according to exemplary embodiments of the present disclosure includes a dome-shaped reflective layer REL and the first and second electrodes EL1 and EL2 including the openings OP, thereby improving the light emission efficiency of the light emitted to the rear surface of the display device 1000.

Figure 11:
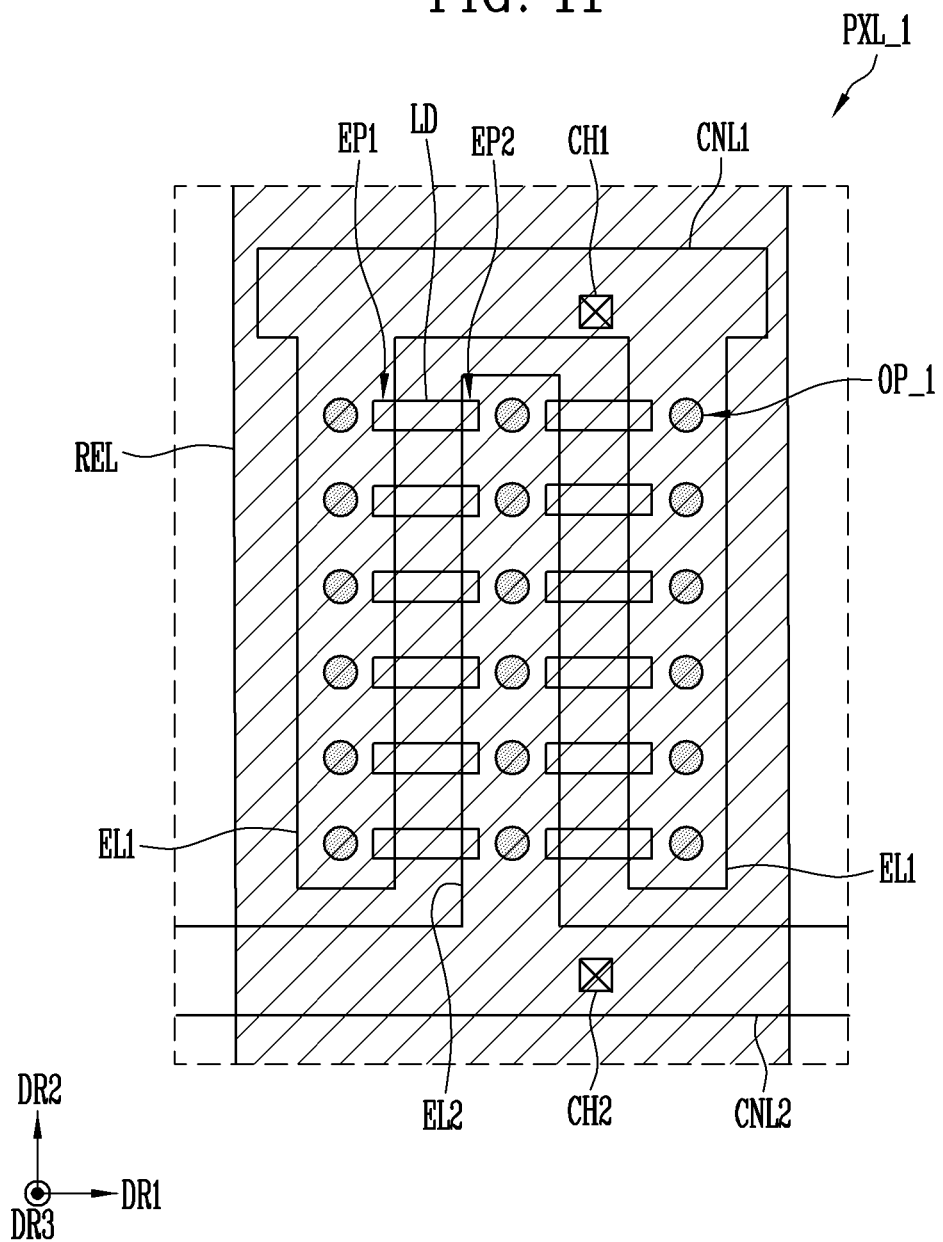
FIG. 11 is a plan view schematically showing a pixel according to another exemplary embodiment.
Figure 12:
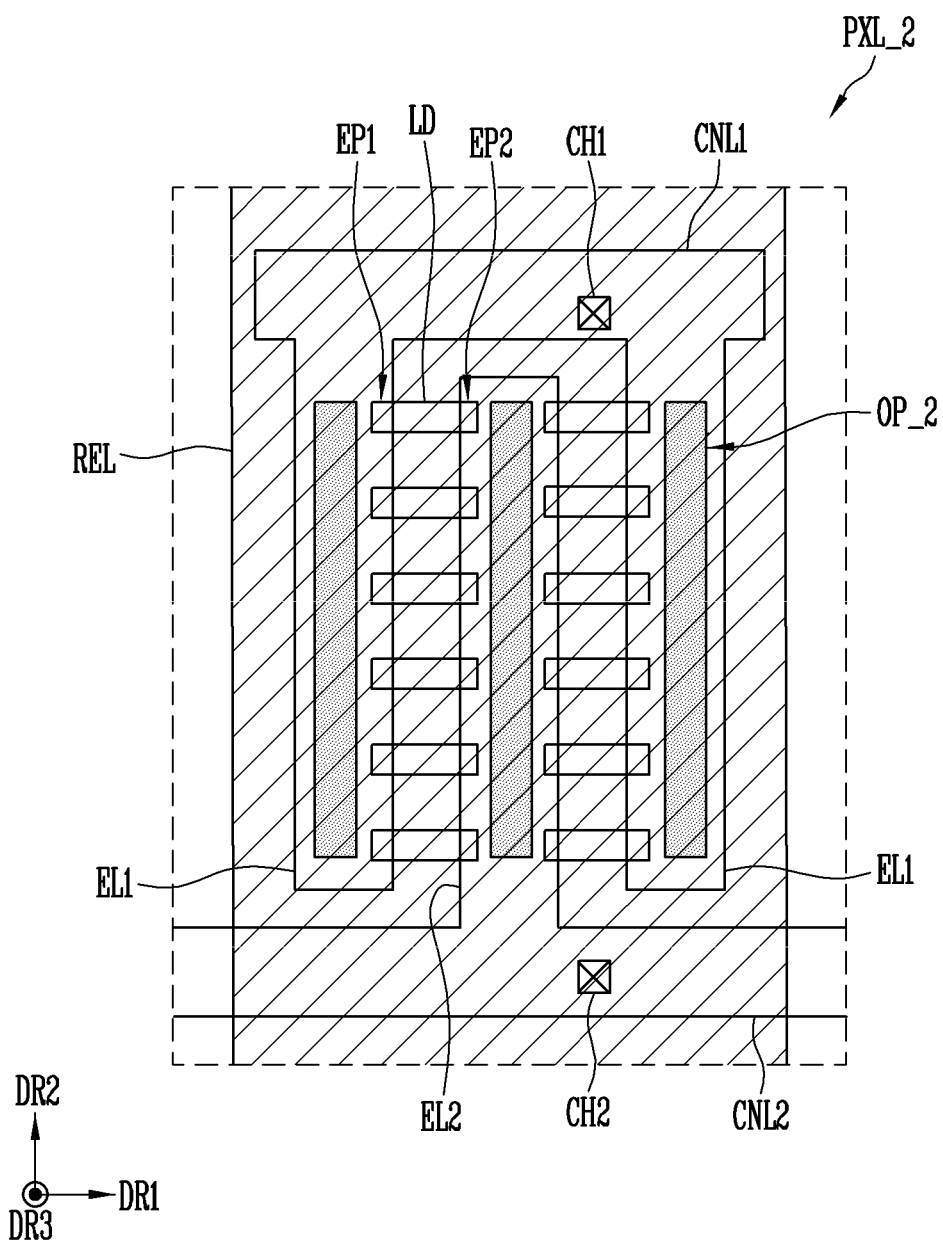
FIG. 12 is a plan view schematically showing a pixel according to another exemplary embodiment.

FIG. 11 is a plan view schematically showing a pixel according to another exemplary embodiment, and FIG. 12 is a plan view schematically showing a pixel according to another exemplary embodiment.

Referring to FIGS. 5, 11, and 12, because the pixels PXL_1 of FIG. 11 and the pixels PXL_2 of FIG. 12 are substantially the same as or similar to the pixels PXL of FIG. 5 except for the shapes of the openings OP_1 or OP_2 of FIGS. 11 and 12, duplicate descriptions thereof will not be repeated here.

Referring to FIG. 11, the openings OP_1 may be formed in a circular shape. Although areas of the openings OP_1 are the same (e.g., substantially the same), when the openings OP_1 are formed in the circular shape and light emitted from the light emitting element LD passes through the openings OP_1, diffraction phenomenon of light may be minimized or reduced, thereby improving a display quality of the display device 1000.

Referring to FIG. 12, the openings OP_2 may be formed to be spaced apart from the light emitting elements LD at a constant (e.g., substantially constant) distance in the first direction DR1, and may be formed to extend in the second direction DR2. In this case, because the areas of the openings OP_2 relatively increase, the transmittance of light (e.g., second light L2 in FIG. 8) emitted from the light emitting element LD and passing through the openings OP_2 increases, and thus the light emission efficiency of the display device 1000 may be further improved. In addition, as the areas of the openings OP_2 increase, the diffraction phenomenon of light may decrease, so that the display quality of the display device 1000 may be improved.

Figure 13:
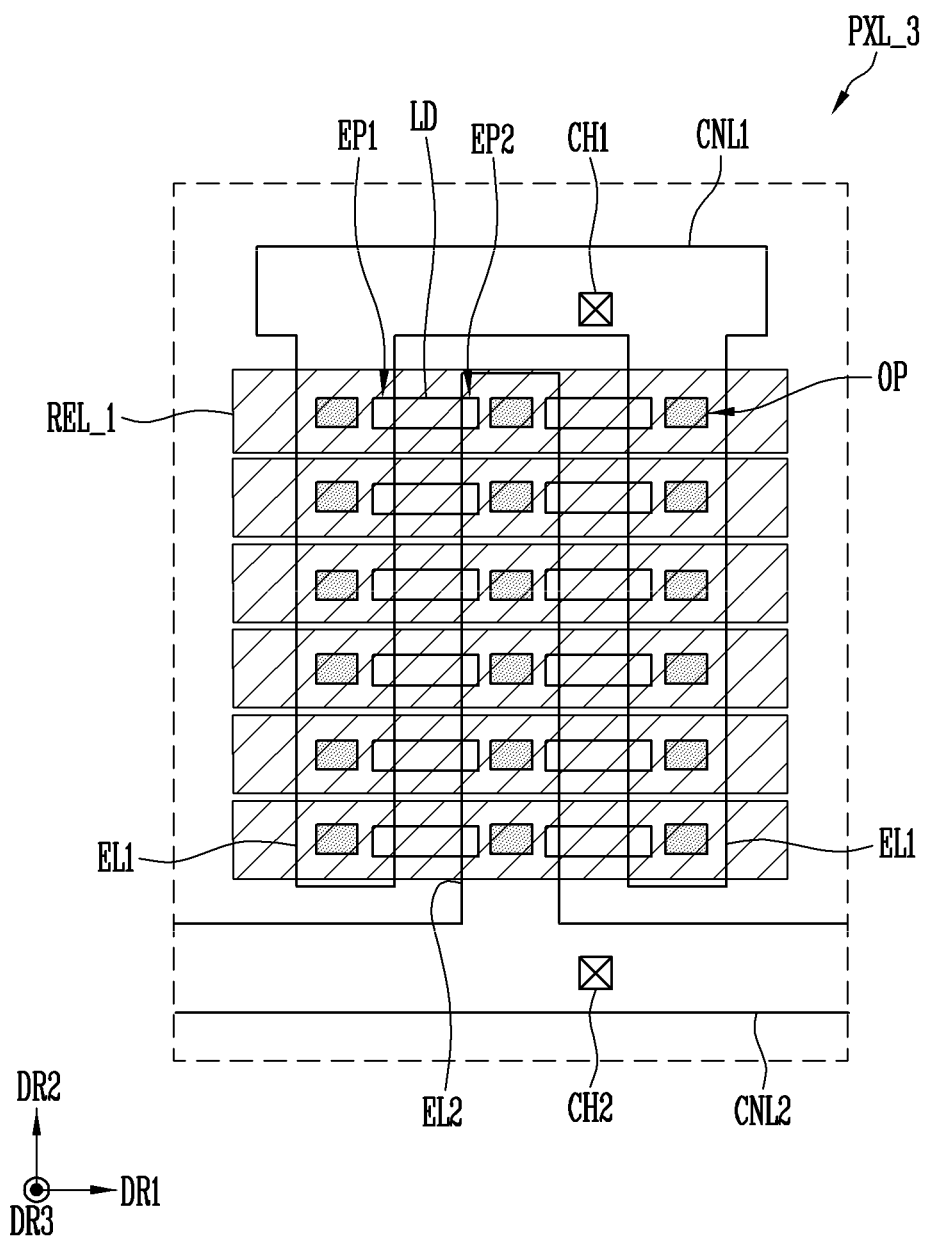
FIG. 13 is a plan view schematically showing a pixel according to another exemplary embodiment.

FIG. 13 is a plan view schematically showing a pixel according to another exemplary embodiment.

Referring to FIGS. 5 and 13, because the pixel PXL_3 of FIG. 13 is substantially the same as or similar to the pixel PXL of FIG. 5 except for the shape of the reflective layer REL_1 of FIG. 13, duplicate descriptions thereof will not be repeated here.

Referring to FIG. 13, the pixel PXL_3 may include a plurality of reflective layers REL_1 (or sub reflective layers). In some embodiments, the reflective layers REL_1 may cover each of the plurality of light emitting elements LD arranged in a line along the second direction DR2. For example, as shown in FIG. 13, when two light emitting elements LD between the first electrode EL1 and the second electrode EL2 are arranged in a line by six lines, six reflective layers REL_1 may be arranged in a line along the second direction DR2 to cover the light emitting elements LD. However, the shape of the reflective layers REL_1 is not limited thereto, for example, the pixel PXL_3 may include three reflective layers REL_1, and each of the reflective layers REL_1 may be arranged to cover the light emitting elements LD by two lines of the six lines in which two light emitting elements LD are in a line.

Figure 14:
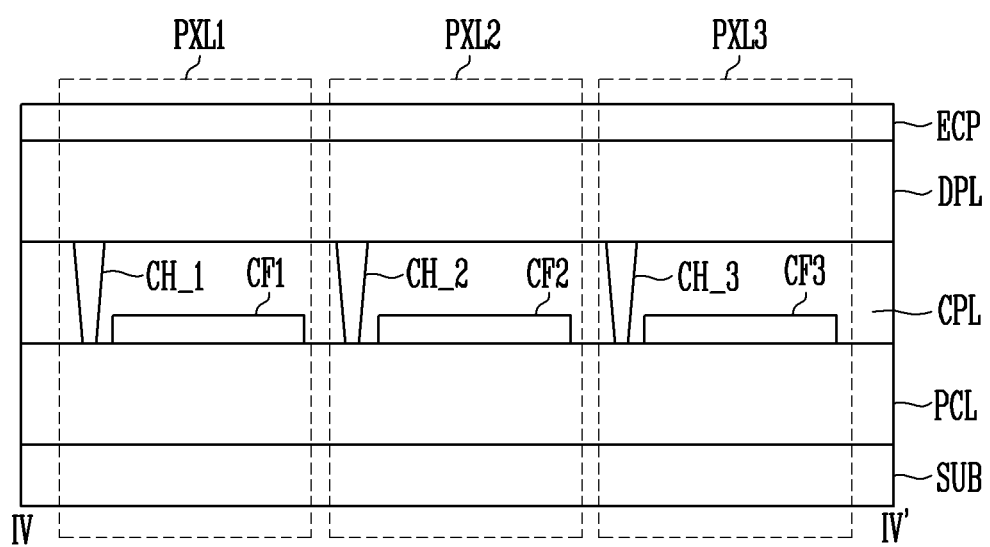
FIG. 14 is an exemplary embodiment of a cross-sectional view taken along a line IV-IV' of FIG. 2.

FIG. 14 is an exemplary embodiment of a cross-sectional view taken along a line IV-IV' of FIG. 2.

Referring to FIGS. 2, 6, 7, 8, and 14, the display device 1000 may include the substrate SUB, the pixel circuit unit PCL, color filter layers CF1, CF2, and CF3, and a capping layer CPL, the display element unit DPL, and the encapsulation layer ECP. Here, because the substrate SUB, the pixel circuit unit PCL, the display element unit DPL, and the encapsulation layer ECP are substantially the same as or similar to the substrate SUB, the pixel circuit unit PCL, the display element unit DPL, and the encapsulation layer ECP described with reference to FIGS. 5 to 8, duplicate descriptions thereof will not be repeated here.

The color filter layers CF1, CF2, and CF3 may be between the pixel circuit part PCL and the display element unit DPL. However, an arrangement relationship of the color filter layers CF1, CF2, and CF3 is not limited thereto, and the color filter layers CF1, CF2, and CF3 may be between the substrate SUB and the pixel circuit unit PCL. The color filter layers CF1, CF2, and CF3 may selectively transmit light of a set or specific color.

The color filter layers CF1, CF2, and CF3 may be arranged according to the light emitted from each of the pixels PXL1, PXL2, and PXL3. In some embodiments, according to the light emitted from each of the pixels PXL1, PXL2, and PXL3, each of the pixels PXL1, PXL2, and PXL3 may include different color filter layers CF1, CF2, and CF3. For example, the first pixel PXL1 that emits light of the first color may include a first color filter layer CF1 to selectively transmit light of the first color, the second pixel PXL2 that emits light of the second color may include a second color filter layer CF2 to selectively transmit light of the second color, and the third pixel PXL3 that emits light of the third color may include a third color filter layer CF3 to selectively transmit light of the third color. Accordingly, the at least one of the first pixel PXL1, the second pixel PXL2, and the third pixel PXL3 adjacent to each other may constitute one pixel unit PXU capable of emitting light of various suitable colors. However, this is exemplary, and at least one of the pixels PXL1, PXL2, and PXL3 may not include a color filter layer. For example, when the light emitting elements LD are made up of a light emitting element that emits light of the third color (e.g., blue light), the third pixel PXL3 emitting light of the third color may not include a color filter layer.

In an exemplary embodiment, the color filter layers CF1, CF2, and CF3 may be color filter layers including wavelength conversion particles. The wavelength conversion particle can convert a peak wavelength of incident light to another set or specific peak wavelength. In some embodiments, the wavelength conversion particle can convert a color of the incident light to another color.

For example, when the light emitting element LD emits blue light, the wavelength conversion particle may convert the blue light provided from the light emitting element LD into light of a different color and emit the light. For example, the wavelength conversion particle may convert blue light provided from the light emitting element LD into red light or green light and emit the light.

The wavelength conversion particle may include, for example, a quantum dot, a quantum rod, and/or a fluorescent substance. The quantum dot may be a particulate material that emits light of a set or specific wavelength as electrons transition from conduction bands to valence bands. Hereinafter, the wavelength conversion particle will be described as being the quantum dot.

The quantum dot may be a semiconductor nanocrystalline material. The quantum dot may have a set or specific band gap depending on a composition and size, and may absorb incident light and then emit light with a unique wavelength. Semiconductor nanocrystals of the quantum dot may include group IV nanocrystals, group II-VI compound nanocrystals, group III-V compound nanocrystals, group IV-VI nanocrystals, a combination thereof, and the like.

For example, the group IV nanocrystal may include silicon (Si), and/or germanium (Ge), or di-element compounds such as silicon carbide (SiC) and/or silicon-germanium (SiGe), but the present disclosure is not limited thereto.

In addition, the group II-VI compound nanocrystal may include di-element compounds such as CdSe, CdTe, ZnS, ZnSe, ZnTe, ZnO, HgS, HgSe, HgTe, MgSe, MgS, and/or mixtures thereof, tri-element compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or mixtures thereof, and/or quaternary-element compounds such as HgZnTeS, CdZnSeS, CdZnSeTe, CdZnSTe, CdHgSeS, CdHgSeTe, CdHgSTe, HgZnSeS, HgZnSeTe, HgZnSTe, and/or mixtures thereof, but the present disclosure is not limited thereto.

In addition, the group III-V compound nanocrystal may include di-element compounds such as GaN, GaP, GaAs, GaSb, AlN, AlP, AlAs, AlSb, InN, InP, InAs, InSb and/or mixtures thereof, tri-element compounds such as GaNP, GaNAs, GaNSb, GaPAs, GaPSb, AlNP, AlNAs, AlNSb, AlPAs, AlPSb, InGaP, InNP, InNAs, InNSb, InPAs, InPSb and/or mixtures thereof, and/or quaternary-element compounds such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and/or mixtures thereof, but the present disclosure is not limited thereto.

The group IV-VI nanocrystal may include di-element compounds such as SnS, SnSe, SnTe, PbS, PbSe, PbTe and/or mixtures thereof, tri-element compounds such as SnSeS, SnSeTe, SnSTe, PbSeS, PbSeTe, PbSTe, SnPbS, SnPbSe, SnPbTe and/or mixtures thereof, and/or quaternary-element compounds such as SnPbSSe, SnPbSeTe, SnPbSTe and/or mixtures thereof, but the present disclosure is not limited thereto.

The shape of the quantum dot is not particularly limited and may be, for example, spherical, pyramidal, multi-arm or cubic nanoparticles, nanotubes, nanolines, nanofibers, nanoplatelet particles, and/or the like. Indeed, the quantum dot may have any suitable shape generally used in the art. The above-described di-element compounds, tri-element compounds and/or quaternary compound may be present in particles at a uniform (e.g., substantially uniform) concentration, or may be present in the same particle, with concentration distributions partially divided into different states.

The quantum dot may have a core-shell structure including a core including the nanocrystals described above and a shell surrounding a core. An interface between the core and the shell may have a concentration gradient in which the concentration of elements present in the shell decreases toward the center. The shell of the quantum dot may serve as a protective layer to prevent or reduce chemical denaturation of the core to maintain a semiconductor characteristic of the core and/or as a charging layer to impart an electrophoretic characteristic to the quantum dot. The shell may be a single layer or a multiple layer. The shell of the quantum dot may be oxide of a metal and/or nonmetal, a semiconductor compound or a combination thereof.

For example, the oxide of the metal and/or nonmetal may be di-element compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or tri-element compounds such as $MgAl_2O_4$, $CoFe_2O_4$, $NiFe_2O_4$, and/or $CoMn_2O_4$, but the present disclosure is not limited thereto.

In addition, the semiconductor compound may be CdS, CdSe, CdTe, ZnS, ZnSe, ZnTe, ZnSeS, GaAs, GaP, GaSb, HgS, HgSe, HgTe, InAs, InP, InSb, AlAs, AlP, AlSb, and/or the like, but the present disclosure is not limited thereto.

The light emitted from the quantum dot described above may have a full width of half maximum of an emission wavelength spectrum (FWHM) of about 45 nm or less, thereby improving color purity and color reproducibility of colors displayed by the display device. In addition, the light emitted from the quantum dot may be emitted toward various directions regardless of an incident direction of an incident light. Therefore, side visibility of the display device may be improved.

However, the color filter layers CF1, CF2, and CF3 may be a color filter layer of an absorption type (or kind) that selectively transmits light of a set or specific color, but absorbs light of other colors.

The capping layer CPL may be on the color filter layers CF1, CF2, and CF3. The capping layer CPL may be an inorganic insulation layer made of an inorganic material. The capping layer CPL may cover the color filter layers CF1, CF2, and CF3 as a whole to serve as an encapsulation layer to prevent or reduce penetration of oxygen and/or moisture from the outside.

In some embodiments, the first connection line CNL1 and the second connection line CNL2 provided to each of the pixels PXL1, PXL2, and PXL3 may be electrically coupled to the transistor T and the power line PL included in the pixel circuit unit PCL through the via holes CH_1, CH_2, and CH_3 passing through the capping layer CPL. Here, each of the via holes CH_1, CH_2, and CH_3 may include the first via hole CH1 and the second via hole CH2 described with reference to FIGS. 5 to 8.

The above-detailed description illustrates and explains embodiments of the present disclosure. In addition, the above-detailed description merely illustrates exemplary embodiments of the present disclosure, the present disclosure may be used in various other combinations, changes, and environments as described above, and the scope of the present disclosure may be changed or modified within the scope of equivalents and/or techniques or knowledge in the art. Therefore, the above-detailed description is not intended to limit the present disclosure to the disclosed embodiments. In addition, the appended claims should be construed to include other embodiments.

What is claimed is:

1. A display device comprising:
   substrate; and
   display element unit,
   wherein the display element unit comprises:
   a first electrode on the substrate;
   a second electrode on the substrate and spaced apart from the first electrode in a first direction;
   a plurality of light emitting elements between the first electrode and the second electrode in a plan view, and
   a first insulation layer on the first electrode and the second electrode,
   wherein the light emitting elements are on the first insulation layer,
   wherein the first insulation layer physically separates the light emitting elements from the first electrode and the second electrode,
   wherein each of the first electrode and the second electrode has an opening, and the opening of the first electrode is surrounded on all sides in a same plane parallel to the substrate by the first electrode, and
   wherein the plurality of light emitting elements do not overlap the opening in the first electrode in the plan view or the opening in the second electrode in the plan view.

2. The display device of claim 1, wherein the opening comprises a plurality of openings arranged in a second direction crossing the first direction.

3. The display device of claim 2, wherein each of the openings is arranged to be spaced apart from each of the light emitting elements at a constant distance in the first direction.

4. The display device of claim 1, wherein the opening extends in a second direction crossing the first direction, and
the opening is spaced apart from the light emitting elements.

5. The display device of claim 1, wherein the opening has a shape of at least one selected from a polygon, a circle, and an ellipse.

6. The display device of claim 1, wherein each of the first electrode and the second electrode comprises a transparent conductive material.

7. The display device of claim 1, further comprising:
an insulation pattern on the light emitting elements; and
a reflective layer on the insulation pattern.

8. The display device of claim 7, wherein the insulation pattern and the reflective layer cover the first electrode, the second electrode, the opening, and the light emitting elements.

9. The display device of claim 7, wherein an upper surface of the reflective layer is curved.

10. The display device of claim 9, wherein the reflective layer has a dome shape, and
wherein the reflective layer includes an inner surface facing the light emitting elements.

11. The display device of claim 7, wherein the light emitting elements are arranged in the second direction that crosses the first direction between the first electrode and the second electrode, and
wherein the insulation pattern and the reflective layer cover at least a portion of the light emitting elements.

12. The display device of claim 7, wherein the reflective layer comprises at least one selected from the group consisting of Ag, Mg, Al, Pt, Pd, Au, Ni, Nd, Ir, Cr, Li, Ca, LiF/Ca, LiF/Al, Mo, Ti, and Cu.

13. The display device of claim 7, wherein the insulation pattern comprises a light-transmitting material.

14. The display device of claim 1, further comprising:
a third electrode that contacts the first electrode and a first end of the light emitting element; and
a fourth electrode that contacts the second electrode and a second end of the light emitting element.

15. The display device of claim 14, wherein the third electrode and the fourth electrode are on the first insulation layer,
wherein the first insulation layer comprises a first contact hole that exposes at least a portion of the first electrode and a second contact hole that exposes at least a portion of the second electrode,
wherein the third electrode contacts the first electrode through the first contact hole, and
wherein the fourth electrode contacts the second electrode through the second contact hole.

16. The display device of claim 14, further comprising:
a fixing layer on the light emitting element, and
wherein the fixing layer is between the third electrode and the fourth electrode, contacts at least a portion of an outer peripheral surface of the light emitting element, and exposes the first end and the second end of the light emitting element.

17. The display device of claim 1, further comprising:
a pixel circuit unit between the substrate and the display element unit, and that provides a driving current to the light emitting elements.

18. The display device of claim 17, further comprising:
a color filter layer between the display element unit and the pixel circuit unit.

19. The display device of claim 18, wherein the color filter layer comprises a wavelength conversion particle.

20. The display device of claim 1, wherein the first insulation layer and the opening are not overlapped with each other in the plan view.

21. The display device of claim 1, wherein the first insulation layer exposes a portion of the first electrode adjacent to the opening and a portion of the second electrode adjacent to the opening.

* * * * *